(12) United States Patent
Park

(10) Patent No.: US 11,018,020 B2
(45) Date of Patent: May 25, 2021

(54) METHOD OF FABRICATING AN INTEGRATED CIRCUIT DEVICE BY USING A BLOCK COPOLYMER TO FORM A SELF-ASSEMBLY LAYER

(71) Applicant: SAMSUNG ELECTRONICS CO., LTD., Suwon-si (KR)

(72) Inventor: Seok-han Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/385,386

(22) Filed: Apr. 16, 2019

(65) Prior Publication Data

US 2020/0105540 A1 Apr. 2, 2020

(30) Foreign Application Priority Data

Oct. 1, 2018 (KR) .................. 10-2018-0117108

(51) Int. Cl.
| | |
|---|---|
| *H01L 21/311* | (2006.01) |
| *H01L 21/768* | (2006.01) |
| *H01L 27/108* | (2006.01) |
| *H01L 21/3105* | (2006.01) |
| *H01L 21/56* | (2006.01) |
| *H01L 49/02* | (2006.01) |

(52) U.S. Cl.
CPC .. *H01L 21/31144* (2013.01); *H01L 21/31058* (2013.01); *H01L 21/565* (2013.01); *H01L 21/76802* (2013.01); *H01L 21/76843* (2013.01); *H01L 27/1085* (2013.01); *H01L 28/90* (2013.01); *H01L 27/10852* (2013.01)

(58) Field of Classification Search
CPC ... H01L 27/1085–1087; H01L 21/768–76898; H01L 28/60; H01L 28/75; H01L 28/82–92; H01L 21/31058; H01L 21/31144; H01L 21/0337; H01L 21/32139
See application file for complete search history.

(56) References Cited

U.S. PATENT DOCUMENTS

| | | | |
|---|---|---|---|
| 6,191,025 B1 * | 2/2001 | Liu | .................. H01L 21/76801 |
| | | | 257/E21.576 |
| 8,083,953 B2 | 12/2011 | Millward et al. | |
| 8,372,295 B2 | 2/2013 | Millward | |

(Continued)

FOREIGN PATENT DOCUMENTS

JP 2018-020282 2/2018

*Primary Examiner* — Younes Boulghassoul
(74) *Attorney, Agent, or Firm* — F. Chau & Associates, LLC

(57) ABSTRACT

A method of fabricating an integrated circuit device includes forming a mold layer on a main surface of a substrate. A first hole is formed in the mold layer having a first inner wall that has a first tilt angle. A first conductive pattern is formed in the first hole. A block copolymer layer is formed on the mold layer and the first conductive pattern. A self-assembly layer is formed having a first domain and a second domain by phase separation of the block copolymer layer. The first domain covers the first conductive pattern and the second domain covers the mold layer. A second hole is formed by removing the first domain, the second hole having a second inner wall that has a second tilt angle. A second conductive pattern is formed in the second hole.

20 Claims, 36 Drawing Sheets

(56) References Cited

U.S. PATENT DOCUMENTS

| | | | |
|---|---|---|---|
| 8,518,788 B2* | 8/2013 | Lee | H01L 27/10852 |
| | | | 438/381 |
| 8,673,771 B2 | 3/2014 | Kawamura | |
| 9,466,527 B2 | 10/2016 | Devilliers | |
| 9,893,157 B1* | 2/2018 | Feilchenfeld | H01L 29/1087 |
| 2008/0286659 A1* | 11/2008 | Millward | B82Y 40/00 |
| | | | 430/5 |
| 2013/0230981 A1* | 9/2013 | Kawamura | H01L 21/76897 |
| | | | 438/637 |
| 2014/0146598 A1 | 5/2014 | Sandhu et al. | |
| 2015/0093702 A1* | 4/2015 | Nyhus | H01L 21/32 |
| | | | 430/270.1 |
| 2015/0162240 A1* | 6/2015 | Chiu | H01L 21/76843 |
| | | | 438/653 |
| 2016/0204002 A1* | 7/2016 | Wallace | H01L 21/4846 |
| | | | 257/773 |
| 2017/0033006 A1* | 2/2017 | Siew | H01L 21/0332 |
| 2017/0107317 A1 | 4/2017 | Kwon et al. | |
| 2017/0330760 A1 | 11/2017 | Singh et al. | |
| 2018/0158694 A1 | 6/2018 | Lin et al. | |
| 2020/0043721 A1* | 2/2020 | Liou | H01L 21/76825 |
| 2020/0105664 A1* | 4/2020 | Han | H01L 23/53295 |
| 2021/0013145 A1* | 1/2021 | Gstrein | H01L 23/5226 |

* cited by examiner

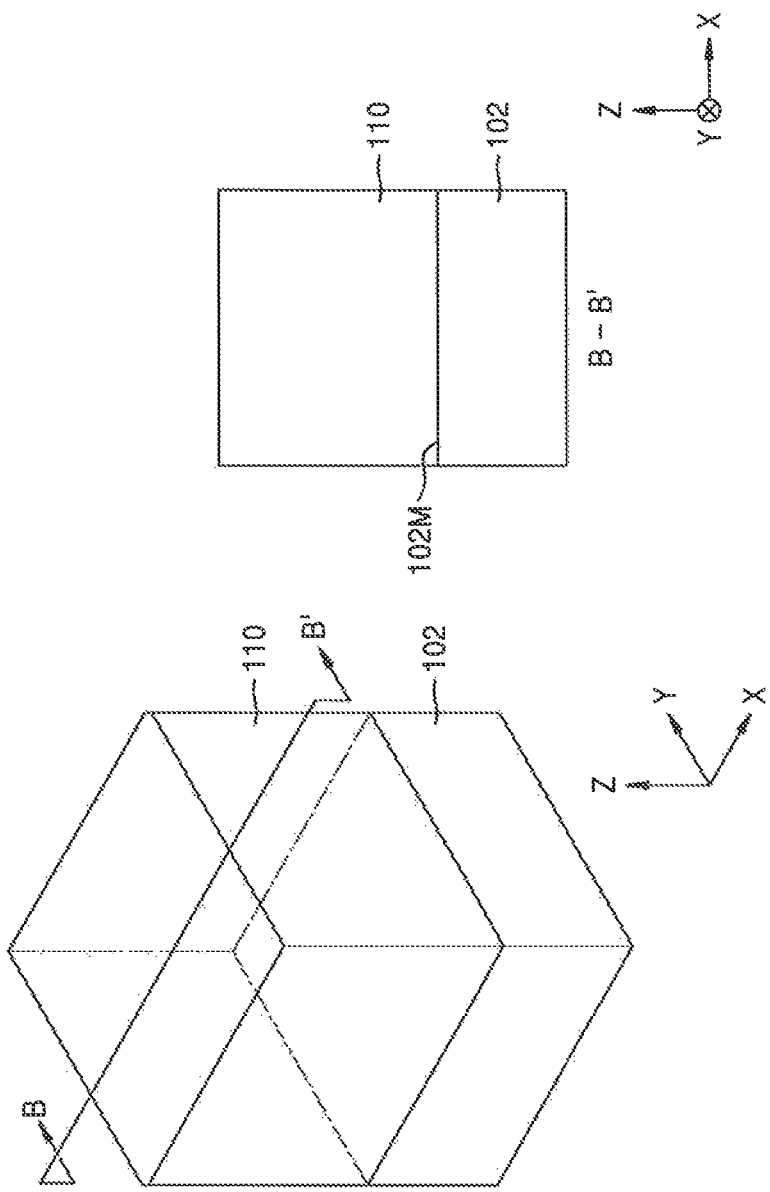

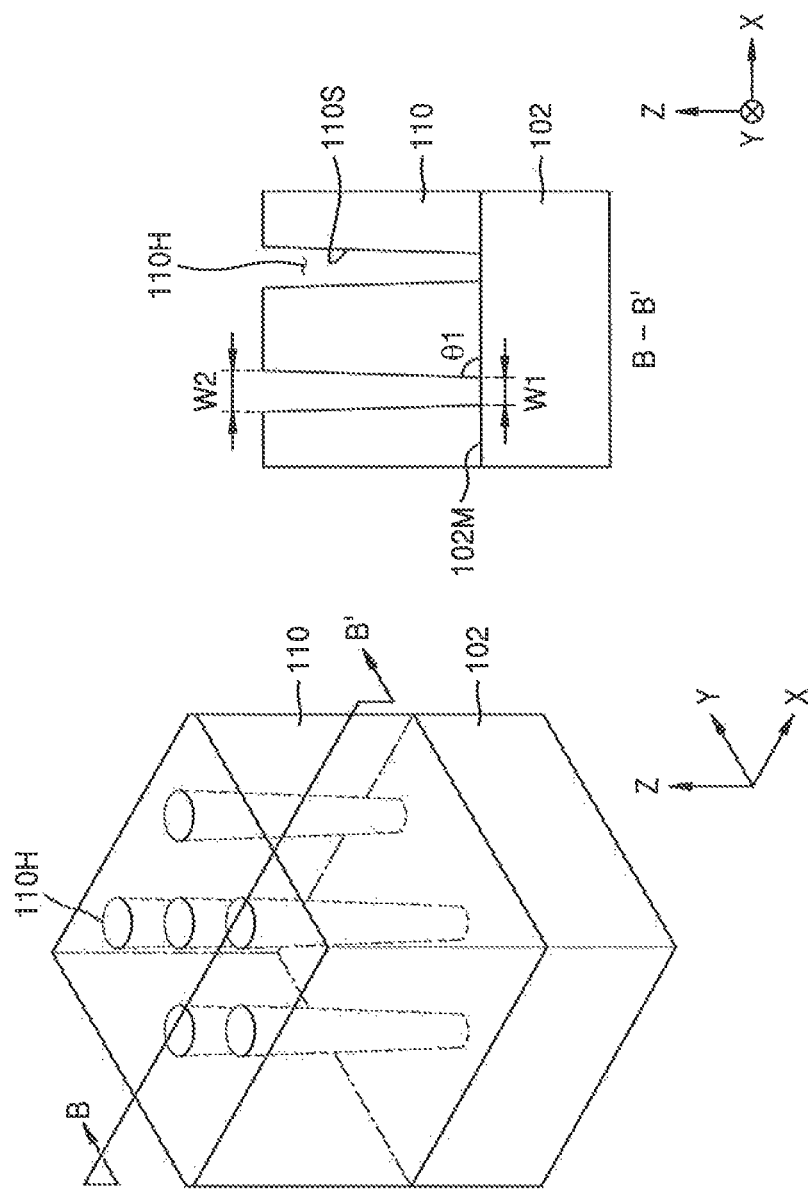

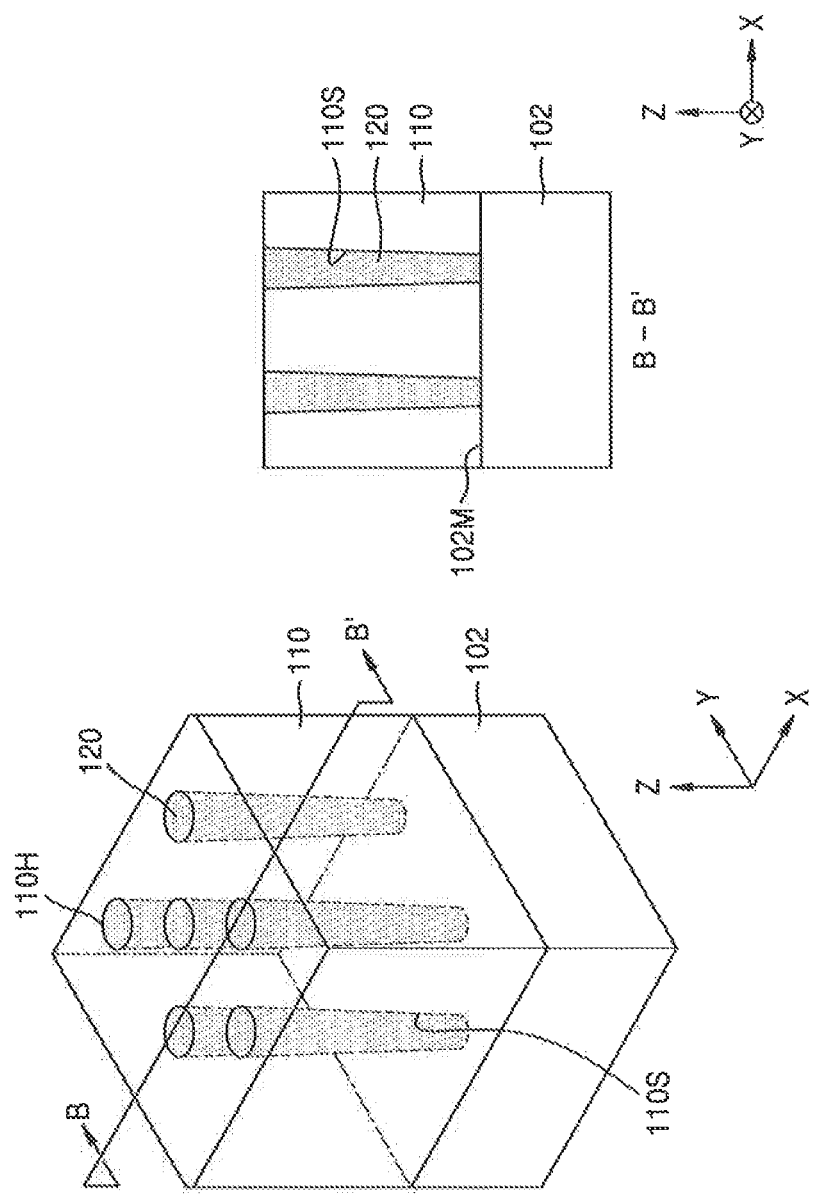

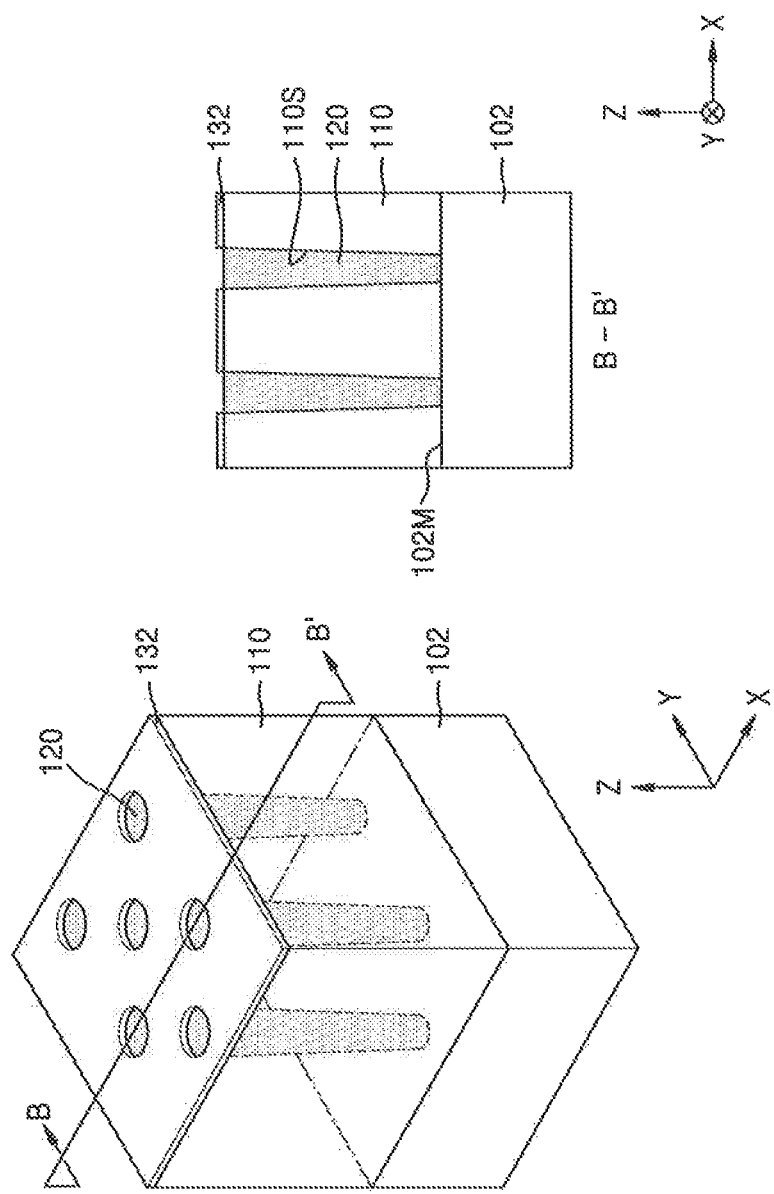

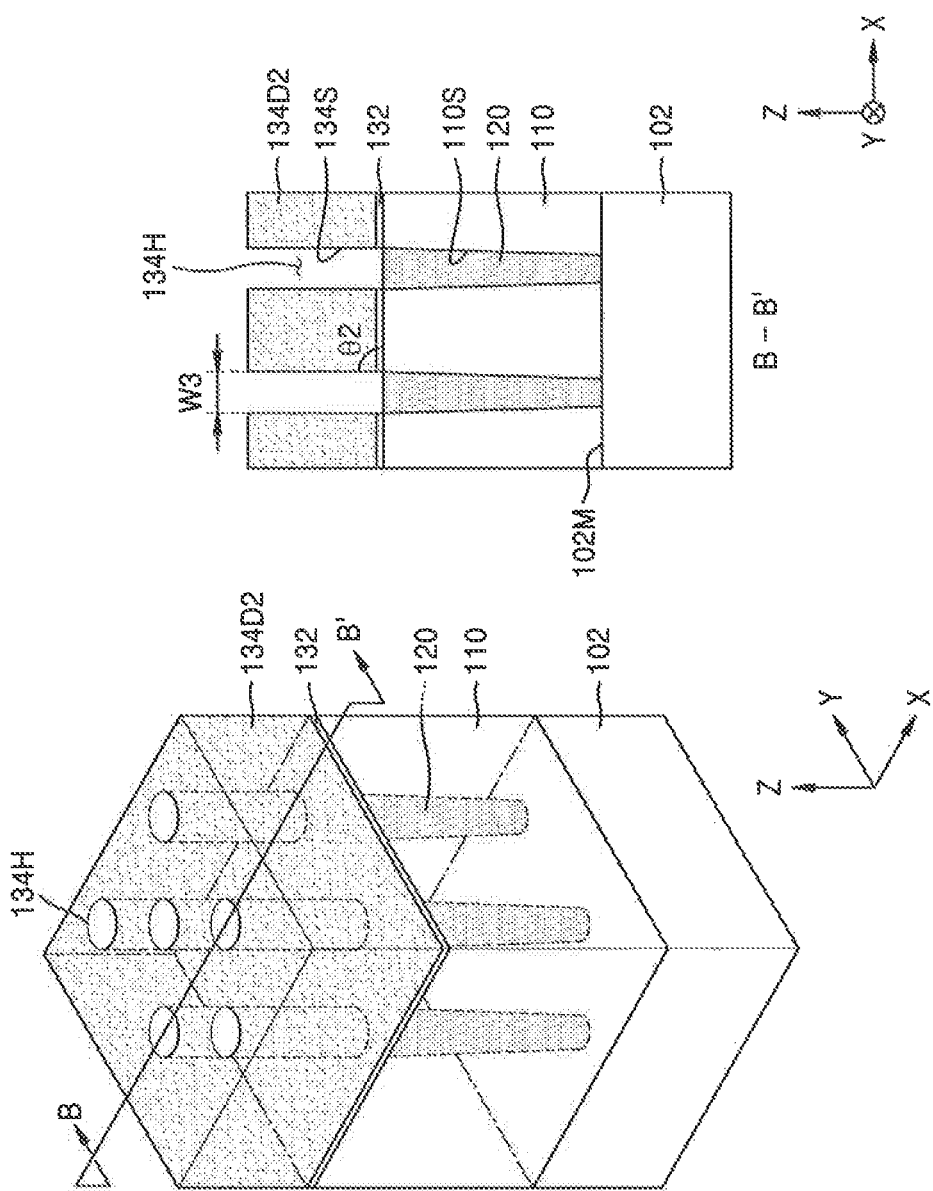

METHOD OF FABRICATING AN INTEGRATED CIRCUIT DEVICE BY USING A BLOCK COPOLYMER TO FORM A SELF-ASSEMBLY LAYER

CROSS-REFERENCE TO RELATED APPLICATION

This application claims priority under 35 U.S.C. § 119 to Korean Patent Application No. 10-2018-0117108, filed on Oct. 1, 2018, in the Korean Intellectual Property Office (KIPO), the disclosure of which is incorporated by reference in its entirety herein.

1. TECHNICAL FIELD

The present inventive concept relates to a method of fabricating an integrated circuit device, and more particularly, to a method of fabricating an integrated circuit device that includes a capacitor.

2. DISCUSSION OF RELATED ART

As the design rules are reduced in integrated circuit devices, such as dynamic random access memory (DRAM), there are limits for storage nodes having a 3-dimensional structure due to the limited space in the region in which the capacitor is formed.

SUMMARY

The inventive concept provides a method of fabricating an integrated circuit device, the method allowing a limit of process technology to be overcome while providing a storage node having a large surface area such that sufficient cell capacitance may be secured within a limited area in a fine-sized integrated circuit device having an extremely small design rule.

According to an exemplary embodiment of the inventive concept, there is provided a method of fabricating an integrated circuit device. The method includes forming a mold layer on a main surface of a substrate. A first hole is formed in the mold layer by partially etching the mold layer. The first hole has a first inner wall that has a first tilt angle with respect to a plane parallel to the main surface of the substrate. A first conductive pattern is formed in the first hole. A block copolymer layer is formed on the mold layer and the first conductive pattern. A self-assembly layer is formed having a first domain and a second domain by performing phase separation of the block copolymer layer. The first domain covers the first conductive pattern and the second domain covers the mold layer. A second hole is formed in the self-assembly layer by removing the first domain from the self-assembly layer. The second hole communicates with the first hole and has a second inner wall having a second tilt angle with respect to a plane parallel to the main surface of the substrate. The second tilt angle is different from the first tilt angle of the first inner wall of the first hole. A second conductive pattern is formed in the second hole. The second conductive pattern contacts the first conductive pattern.

According to another exemplary embodiment of the inventive concept, there is provided a method of fabricating an integrated circuit device. The method includes forming a mold layer on a substrate. A plurality of first holes is formed in the mold layer by partially etching the mold layer. A plurality of first conductive patterns is formed in the plurality of first holes. At least one upper conductive pattern is formed on the plurality of first conductive patterns. The at least one upper conductive pattern is connected to the plurality of first conductive patterns. The at least one upper conductive pattern is formed by performing an upper conductive pattern forming process at least once. The upper conductive pattern forming process includes forming a self-assembly layer having a plurality of first domains and a second domain by using a block copolymer. The plurality of first domains covers the plurality of first conductive patterns. The second domain surrounds the plurality of first domains and covers the mold layer. A plurality of second holes is formed by removing the plurality of first domains. The plurality of second holes communicates with the plurality of first holes. An inside of each of the plurality of second holes is filled with a conductive material.

According to yet another exemplary embodiment of the inventive concept, there is provided a method of fabricating an integrated circuit device. The method includes forming a mold layer on a substrate. A plurality of first holes in the mold layer is formed by partially etching the mold layer. A plurality of first conductive patterns is formed in the plurality of first holes. A self-assembly layer is formed by using a block copolymer. The self-assembly layer includes a plurality of first domains self-assembled on the plurality of first conductive patterns and a second domain self-assembled on the mold layer. A plurality of second holes is formed by removing the plurality of first domains. The plurality of second holes exposes the plurality of first conductive patterns. The second domain is converted into an inorganic oxide layer. A plurality of second conductive patterns is formed in the plurality of second holes. The plurality of second conductive patterns is connected to the plurality of first conductive patterns. The inorganic oxide layer and the mold layer are removed.

BRIEF DESCRIPTION OF THE DRAWINGS

Exemplary embodiments of the inventive concept will be more clearly understood from the following detailed description taken in conjunction with the accompanying drawings, in which:

FIGS. 1A, 2A, 3A, 4A, 5A, 6A, 7A, 8A, 9A and 10A are perspective views illustrating processes of a method of fabricating an integrated circuit device according to exemplary embodiments of the present inventive concept;

FIGS. 1B, 2B, 3B, 4B, 5B, 6B, 7B, 8B, 9B and 10B are cross-sectional views taken along line B-B' in FIGS. 1A, 2A, 3A, 4A, 5A, 6A, 7A, 8A, 9A and 10A, respectively, illustrating processes of a method of fabricating an integrated circuit device according to exemplary embodiments of the present inventive concept;

DETAILED DESCRIPTION OF THE EXEMPLARY EMBODIMENTS

Figure 5B:
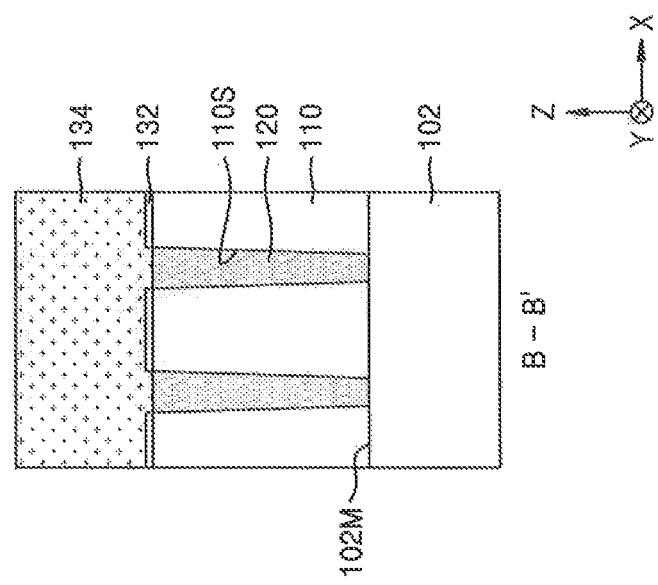

Hereinafter, exemplary embodiments of the inventive concept will be described in detail with reference to the accompanying drawings. Like components will be denoted by like reference numerals throughout the specification, and repeated descriptions thereof will be omitted.

Referring to FIGS. 1A-1B, a mold layer 110 is formed on a main surface 102M of a substrate 102.

The substrate 102 may include a semiconductor substrate. In some exemplary embodiments, the substrate 102 may include a semiconductor such as Si or Ge. In other exemplary embodiments, the substrate 102 may include a compound semiconductor such as SiGe, SiC, GaAs, InAs, or InP. The substrate 102 may include a conductive region. For example, the conductive region may be an impurity-doped well or an impurity-doped structure. In addition, the substrate 102 may have a device isolation structure such as a shallow trench isolation (STI) structure. In some embodiments, the substrate 102 may include a cell array area of dynamic random access memory (DRAM).

In an exemplary embodiment, the mold layer 110 may include silicon oxide.

Referring to FIGS. 2A-2B, a plurality of first holes 110H may be formed in the mold layer 110 by partially etching the mold layer 110.

To form the plurality of first holes 110H, a mask pattern may be formed on the mold layer 110, followed by anisotropically etching the mold layer 110 by using the mask pattern as an etch mask. In exemplary embodiments, the mask pattern may include an oxide film, a nitride film, a polysilicon film, a photoresist film, or a combination thereof. After the plurality of first holes 110H are formed, a top surface of the mold layer 110 may be exposed by removing the mask pattern remaining on the mold layer 110.

In an exemplary embodiment, the plurality of first holes 110H may form a hexagonal array in which the plurality of first holes 110H are regularly arranged at regular pitches. Each of the plurality of first holes 110H may have a first inner wall 110S having a first tilt angle $\theta 1$ with respect to a plane parallel to the main surface 102M of the substrate 102. In some exemplary embodiments, the first tilt angle $\theta 1$ may range from about 80° to about 85°, without being limited thereto. As the first inner wall 110S of each of the plurality of first holes 110H has the first tilt angle $\theta 1$, the width W1 of a bottom of each of the plurality of first holes 110H may be less than the width W2 of the top (e.g., an entrance) of each of the plurality of first holes 110H. For example, the width W1 of the bottom of each of the plurality of first holes 110H may be about 85% of the width W2 of the top (e.g., entrance) of each of the plurality of first holes 110H, without being limited thereto.

Referring to FIGS. 3A-3B, a plurality of first conductive patterns 120 are respectively formed in the plurality of first holes 110H.

In some exemplary embodiments, to form the plurality of first conductive patterns 120, a conductive material may be deposited on the mold layer 110 having the plurality of first holes 110H as shown in FIGS. 2A-2B, such that the conductive material has a thickness sufficient to fill the plurality of first holes 10H and form a first conductive layer. The first conductive layer may then be partially removed to expose the top surface of the mold layer 110. In an exemplary embodiment, only portion of the first conductive layer that are arranged in the plurality of first holes 110H, may remain after the partial removal of the first conductive layer. In exemplary embodiments, a chemical vapor deposition (CVD), metal organic CVD (MOCVD), or atomic layer deposition (ALD) process may be used to form the first conductive layer.

In some exemplary embodiments, each of the plurality of first conductive patterns 120 may include a metal, a metal nitride, or a combination thereof. For example, each of the plurality of first conductive patterns 120 may include TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof, without being limited thereto.

After the plurality of first conductive patterns 120 are formed, a native oxide film remaining on a surface of the mold layer 110 may be removed by using oxygen plasma and cleaning may be performed. This results in an —OH group being exposed at the surface of the mold layer 110. However, exposed surfaces of the plurality of first conductive patterns 120 may not include —OH groups.

Referring to FIGS. 4A-4B, among the surface of the mold layer 110 and the surfaces of the plurality of first conductive patterns 120 that are exposed on the substrate 102, a brush liner 132 may be selectively formed only on the surface of the mold layer 110.

The brush liner 132 may include an inorganic material or an organic material.

In some exemplary embodiments, the brush liner 132 may include a monomer including silicon, an oligomer including silicon, or a polymer including silicon. For example, the brush liner 132 may include a polymer layer including polydimethylsiloxane (PDMS) as a main component. To form the brush liner 132 including PDMS, hydroxyl group-terminated PDMS may be supplied to the surface of the mold layer 110 as an anchoring polymer. As a result, the brush liner 132 including PDMS may be selectively covalently bonded to the surface of the mold layer 110 through the medium of oxygen atoms. In this exemplary embodiment, the brush liner 132 is not formed on the surfaces of the plurality of first conductive patterns 120.

In some other exemplary embodiments, the brush liner 132 may include an organic monomer, an organic oligomer, or an organic polymer. For example, the brush liner 132 may include polystyrene (PS). To form the brush liner 132 including PS, hydroxyl group-terminated PS may be supplied to the surface of the mold layer 110 as an anchoring polymer. As a result, the brush liner 132 including PS may be covalently bonded to the surface of the mold layer 110 through the medium of oxygen atoms.

In one exemplary embodiment, the brush liner 132 may be formed by a spin coating process. For example, a PDMS solution including PDMS-OH dissolved in an organic solvent such as toluene, propylene glycol methyl ether acetate (PGMEA), or tetrahydrofuran (THF), or a PS solution including PS—OH dissolved in the organic solvent set forth above may be spin-coated on the mold layer 110 and the plurality of first conductive patterns 120. The PDMS solution or the PS solution may then be heat treated at a temperature of about 180° C. to about 250° C. for about 5 minutes to about 24 hours in a vacuum or nitrogen atmosphere. This results in the brush liner 132 being selectively formed only on the mold layer 110. An unreacted portion of the PDMS or PS solution may then be removed. To remove the unreacted portion of the PDMS or PS solution, an organic solvent may be used. The organic solvent may include PGMEA, propylene glycol monomethyl ester (PGME), ethyl-3-ethoxy propionate (EEP), ethyl lactate (EL), methyl 2-hydroxybutyate (HBM), gamma-butyro lactone (GBL), or the like, without being limited thereto.

In some exemplary embodiments, the brush liner 132 may be formed to a thickness of about 2 nm to about 15 nm on the surface of the mold layer 110, without being limited thereto.

In some exemplary embodiments, the brush liner 132 described with reference to FIGS. 4A-4B may be omitted.

Figure 5A:
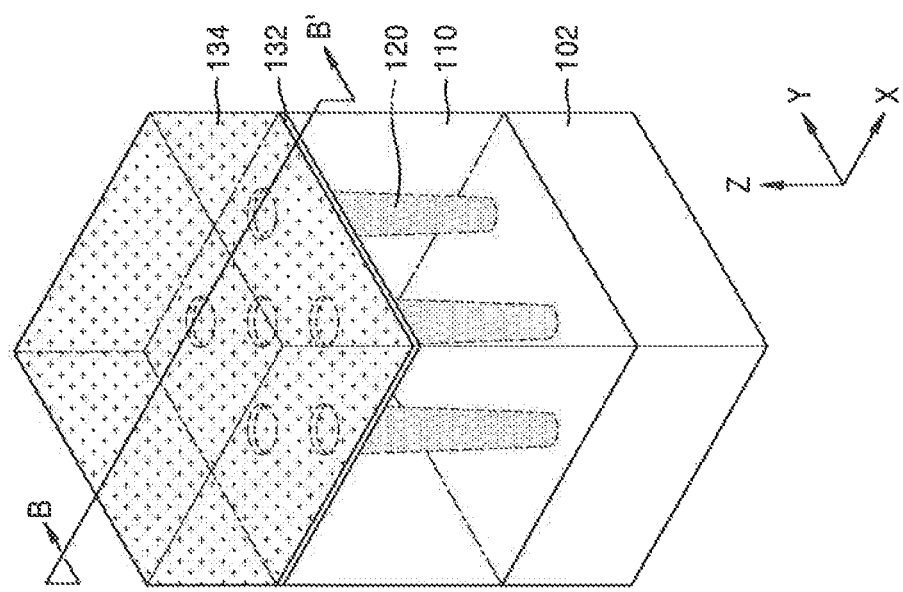

Referring to FIGS. 5A-5B, a block copolymer layer 134 is formed on the brush liner 132 and the plurality of first conductive patterns 120. However, in exemplary embodiments in which the process of forming the brush liner 132 is omitted, the block copolymer layer 134 may be formed directly on the mold layer 110 and the plurality of first conductive patterns 120.

In some exemplary embodiments, the block copolymer layer 134 may include a copolymer of an organic polymer and an inorganic polymer. In other exemplary embodiments, the block copolymer layer 134 may include a copolymer of two different organic polymers from each other.

In some exemplary embodiments, the block copolymer layer 134 may include a diblock copolymer in which a first polymer block having a first repeat unit is connected to a second polymer block having a second repeat unit by a covalent bond. In some embodiments, the diblock copolymer may include a linear or branched polymer having a molecular weight of about 3,000 g/mol to about 2,000,000 g/mol.

In other exemplary embodiments, the block copolymer layer 134 may include a copolymer other than the diblock copolymer. For example, a triblock copolymer or a multi-block copolymer may be included on the block copolymer layer. In some other embodiments, the block copolymer layer 134 may further include at least one homopolymer.

In exemplary embodiments in which the block copolymer layer 134 includes a copolymer of an organic polymer and an inorganic polymer in a diblock copolymer, the first polymer block may include PS and the second polymer block may include PDMS, without being limited thereto. For example, the diblock copolymer may include polybutadiene-b-polydimethylsiloxane, polyisobutylene-b-polydimethylsiloxane, polystyrene-b-polyferrocenyldimethylsilane, or polystyrene-b-polyferrocenyl ethylmethyl silane.

In exemplary embodiments in which the block copolymer layer 134 includes a copolymer of two different organic polymers from each other, in the diblock copolymer, the first polymer block may include poly(methyl methacrylate) (PMMA), poly(ethylene oxide) (PEO), poly(lactic acid) (PLA), or polyisoprene (PI) and the second polymer block may include PS, without being limited thereto.

In the block copolymer layer 134, the first polymer block may constitute a minor block, and the second polymer block may constitute a major block. In some exemplary embodiments, in the diblock copolymer, a volume ratio of the first polymer block to the second polymer block may be variously selected from a range of about 20:80 to about 40:60.

In some exemplary embodiments, to form the block copolymer layer 134, a block copolymer selected from among the various copolymers set forth above as examples may be dissolved in an organic solvent. The obtained solution may then be coated on the brush liner 132 and the plurality of first conductive patterns 120 by a dip coating, solution casting, or spin coating process. The organic solvent may include PGMEA, PGME, EEP, EL, HBM, GBL, toluene, or THF, without being limited thereto.

In an exemplary embodiment in which the brush liner 132 described with reference to FIGS. 4A-4B is formed, the block copolymer layer 134 may be coated directly on the brush liner 132 and the plurality of first conductive patterns 120. In some exemplary embodiments, when the block copolymer layer 134 includes a copolymer of an organic polymer and an inorganic polymer, the brush liner 132 may have an identical or similar structure to the inorganic polymer. For example, the brush liner 132 may include PDMS and the block copolymer layer 134 may include PS-b-PDMS. In other exemplary embodiments, when the block copolymer layer 134 includes a copolymer of two different organic polymers from each other, the brush liner 132 may include an organic polymer. For example, the brush liner 132 may include PS and the block copolymer layer 134 may include PS-b-PMMA.

In an exemplary embodiment, the block copolymer layer 134 may have a thickness of about 50 nm to about 100 nm, without being limited thereto.

Figures 6A, 6B:
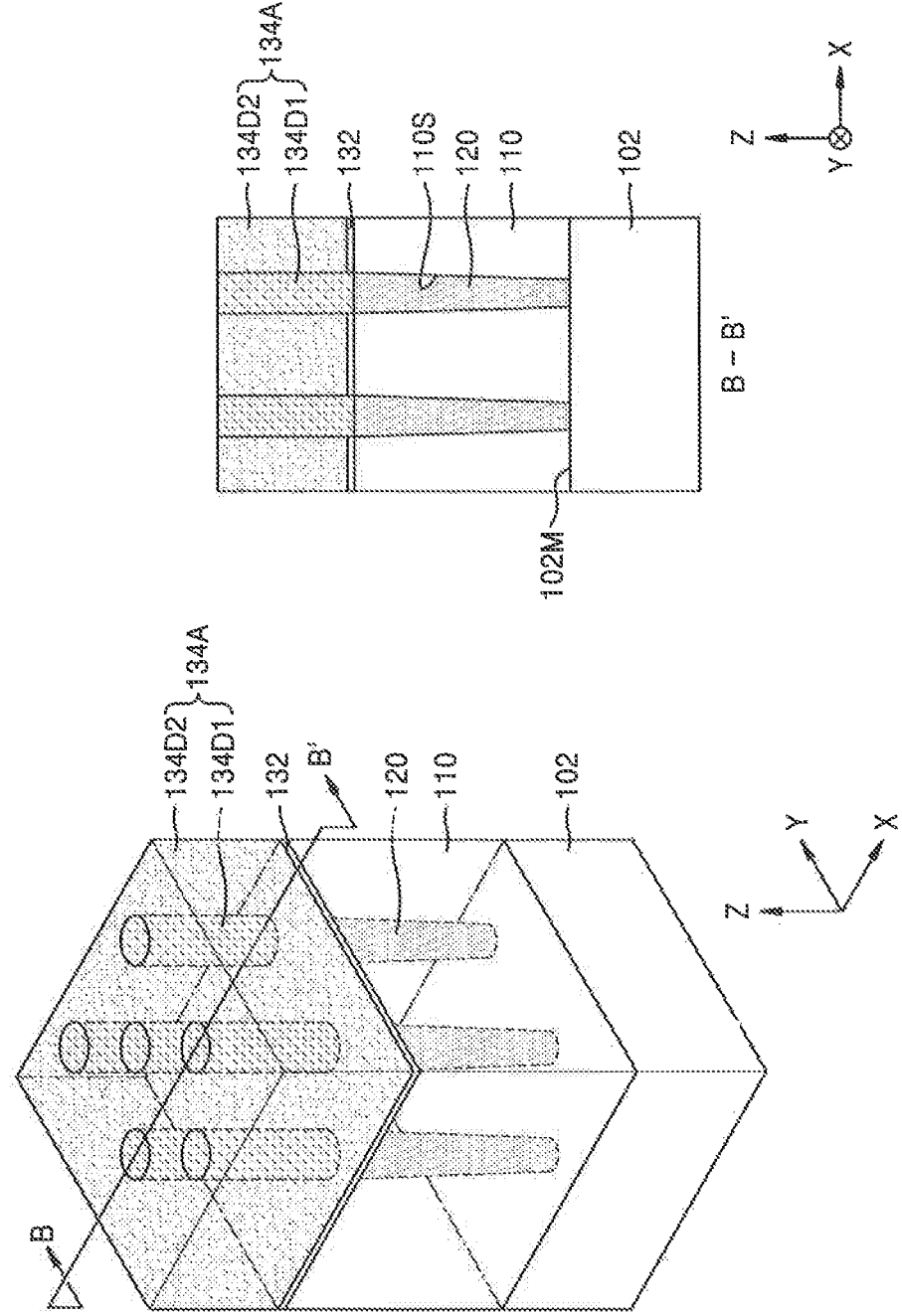

Referring to FIGS. 6A-6B, the block copolymer layer 134 of the device shown in FIGS. 5A-5B may undergo phase separation to form a self-assembly layer 134A having a plurality of first domains 134D1 and a second domain 134D2. The plurality of first domains 134D1 may cover the plurality of first conductive patterns 120. The second domain 134D2 may surround the plurality of first conductive patterns 120 and cover the mold layer 110.

In exemplary embodiments, the second domain 134D2 of the self-assembly layer 134A may include a polymer block having higher affinity to the brush liner 132. In some exemplary embodiments, when the brush liner 132 includes PDMS and the block copolymer layer 134 includes PS-b-PDMS, each of the plurality of first domains 134D1 may include a PS block and the second domain 134D2 may include a PDMS block. In other exemplary embodiments, when the brush liner 132 includes PS and the block copolymer layer 134 includes PS-b-PMMA, each of the plurality of first domains 134D1 may include a PMMA block and the second domain 134D2 may include a PS block.

For the phase separation of the block copolymer layer 134, the block copolymer layer 134 may be annealed at a temperature that is higher than a glass transition temperature (Tg) of a block copolymer in the block copolymer layer 134. For example, in an exemplary embodiment, to perform the phase separation of the block copolymer layer 134, the block copolymer layer 134 may be annealed at a temperature selected from a range of about 130° C. to about 190° C. for about 1 hour to about 24 hours.

The plurality of first domains 134D1 may form a hexagonal array in which the plurality of first domains 134D1 are regularly arranged at regular pitches like the arrangement of the plurality of first holes 110H.

Referring to FIGS. 7A-7B, the plurality of first domains 134D1 of the self-assembly layer 134A are removed from the device shown in FIGS. 6A-6B. In some exemplary embodiments, to selectively remove only the plurality of first domains 134D1 and leave the second domain 134D2 intact, the first domains may be selectively decomposed by applying a polymer decomposer to the self-assembly layer 134A, followed by stripping the decomposed plurality of first domains 134D1 by using a cleaning solution, such as isopropyl alcohol (IPA). In some exemplary embodiments, a radiant ray or plasma may be used as the polymer decomposer. For example, the radiant ray may be provided in an oxygen atmosphere and may be deep ultraviolet (DUV), a soft X-ray, or an electron beam (E-beam). The plasma may be oxygen plasma.

After the plurality of first domains 134D1 are removed, a plurality of second holes 134H are formed over the substrate 102. The plurality of second holes 134H penetrate the second domain 134D2. The plurality of second holes 134H may respectively communicate with the plurality of first holes 110H. Top surfaces of the plurality of first conductive patterns 120 may be exposed by the plurality of second holes 134H.

Each of the plurality of second holes 134H may have a second inner wall 134S having a second tilt angle θ2 with respect to a plane parallel to the main surface 102M of the substrate 102. The second tilt angle θ2 may be different from the first tilt angle θ1. In an exemplary embodiment, the second tilt angle θ2 may be greater than the first tilt angle θ1 and may be closer to a vertical direction (Z direction) than the first tilt angle θ1. In some exemplary embodiments, the second inner wall 134S of each second hole 134H may be approximately perpendicular to a plane parallel to the main surface 102M of the substrate 102.

In an exemplary embodiment, a width W3 of the top (e.g., entrance) of each of the plurality of second holes 134H may be approximately equal to a width of a bottom of each of the plurality of second holes 134H. The width of the bottom of each of the plurality of second holes 134H may be approximately equal, or similar, to the width W2 of the top (e.g., entrance) of each of the plurality of first holes 110H described with reference to FIGS. 2A-2B. The plurality of second holes 134H may form a hexagonal array in which the plurality of second holes 134H are regularly arranged at regular pitches like the arrangement of the plurality of first holes 110H.

Figure 8B:
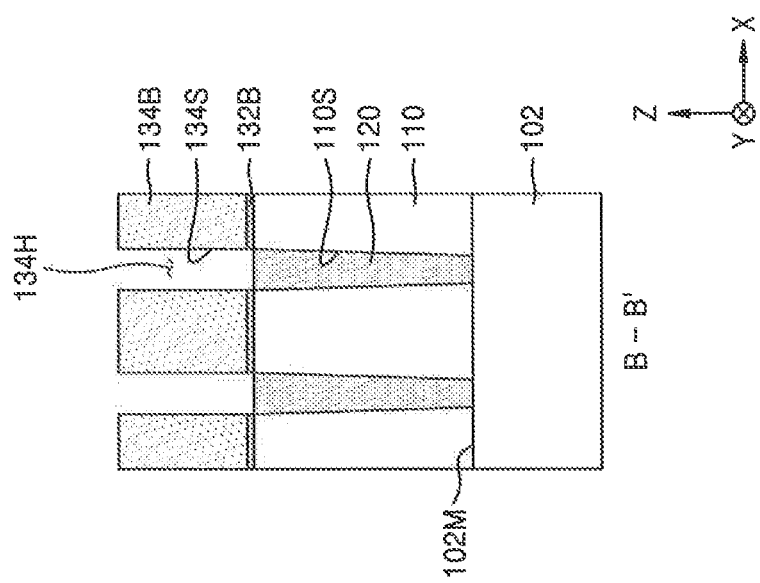
Figure 8A:
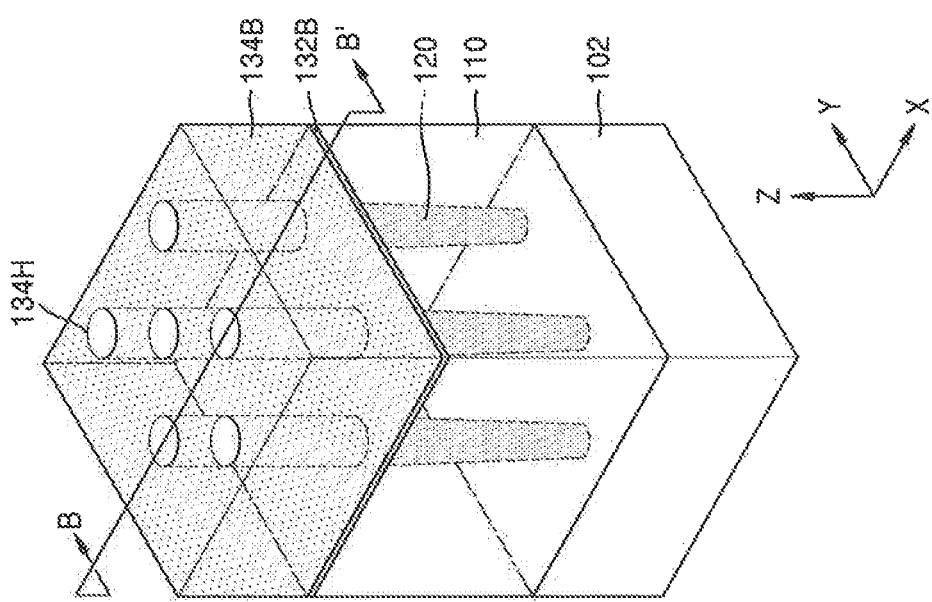

Referring to FIGS. 8A-8B, the second domain 134D2 of the device of FIGS. 7A-7B may be converted into an inorganic oxide layer 134B by oxidizing the second domain 134D2.

In some exemplary embodiments, the second domain 134D2 may be treated with oxygen plasma to oxidize the second domain 134D2 and convert the second domain 134D2 into the inorganic oxide layer 134B. In exemplary embodiments in which the second domain 134D2 includes a PDMS block, the PDMS block may be converted into a silicon oxide film as a result of the oxygen plasma treatment of the second domain 134D2. In the exemplary embodiment in which the brush liner 132 includes PDMS, the brush liner 132 may also be converted into an inorganic oxide liner 132B. Each of the inorganic oxide liner 132B and the inorganic oxide layer 134I may include $SiO_x$ (where x is an integer of 1 to 4).

In other exemplary embodiments, when the brush liner 132 includes PS and the second domain 134D2 includes a PS block, the process of oxidizing the second domain 134D2, which has been described with reference to FIGS. 8A-8B, may be omitted.

Figure 9A:
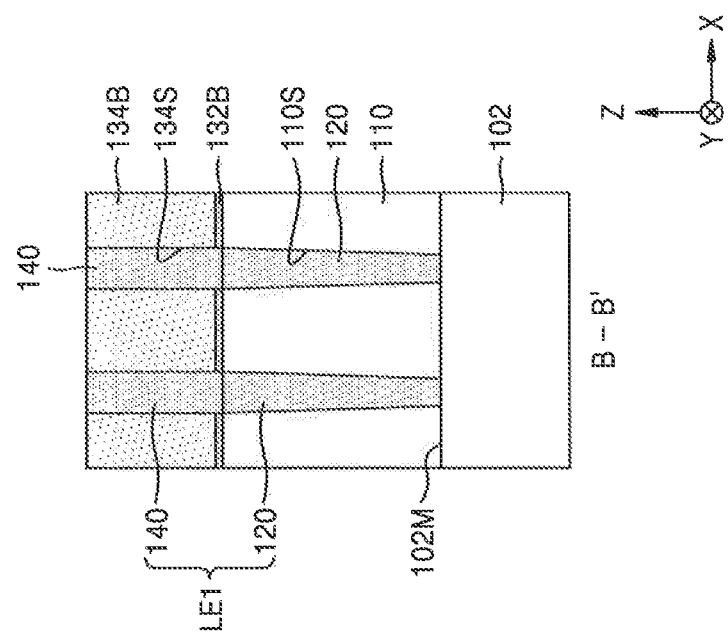
Figure 9B:
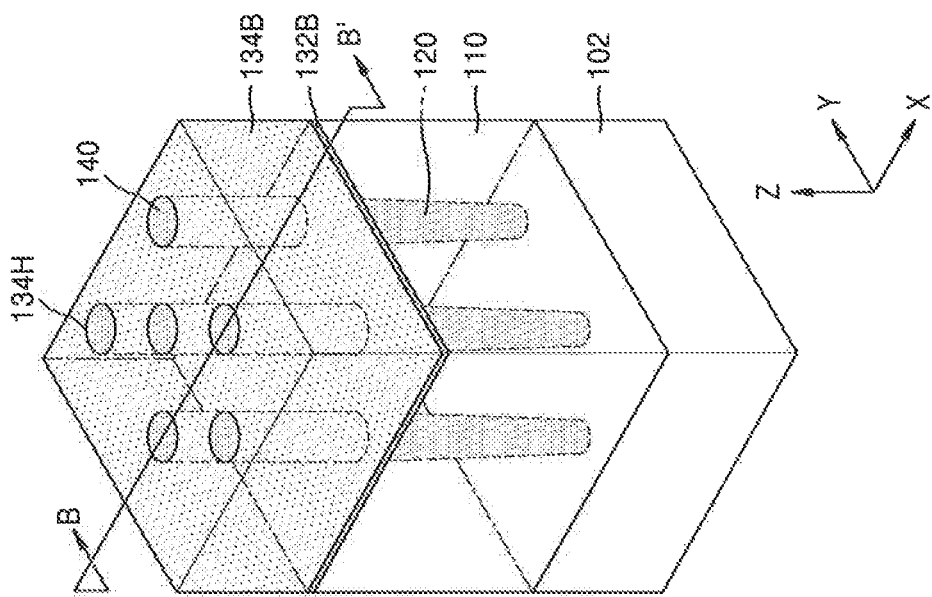

Referring to FIGS. 9A-9B, a plurality of second conductive patterns 140 may be respectively formed in the plurality of second holes 134H. The plurality of second conductive patterns 140 may contact the top surfaces of the plurality of first conductive patterns 120. The plurality of first conductive patterns 120 and the plurality of second conductive patterns 140 may constitute a plurality of lower electrodes LE1.

To form the plurality of second conductive patterns 140, a second conductive layer may be formed by depositing a conductive material on the device of FIGS. 8A-8B which include the plurality of second holes 134H. The conductive material may have a thickness sufficient to fill the plurality of second holes 134H. The second conductive layer may then be partially removed so that a top surface of the inorganic oxide layer 134B is exposed and only the portions of the second conductive layer which are arranged in the plurality of second holes 134H may remain. In some exemplary embodiments, each of the plurality of second conductive patterns 140 may include a metal, a metal nitride, or a combination thereof. For example, each of the plurality of second conductive patterns 140 may include TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof, without being limited thereto. In some exemplary embodiments, a constituent material of each of the plurality of second conductive patterns 140 may be identical to that of each of the plurality of first conductive patterns 120.

In some embodiments, a CVD, MOCVD, or ALD process may be used to form the second conductive layer. For example, the second conductive layer may be formed by an ALD process that is performed at a relatively low temperature of about 100° C. to about 600° C.

In an exemplary embodiment in which the process of oxidizing the second domain 134D2 described with reference to FIGS. 8A-8B is omitted, the plurality of second conductive patterns 140 may be formed to respectively fill the plurality of second holes 134H in the device shown in FIGS. 7A-7B. In this exemplary embodiment, the second conductive layer may be formed by depositing a conductive material on the device shown in FIGS. 7A-7B, in which the plurality of second holes 134H are formed, such that the conductive material has a thickness sufficient to fill the plurality of second holes 134H. The second conductive layer is then partially removed such that a top surface of the second domain 134D2 is exposed, whereby only the portions of the second conductive layer that are arranged in the plurality of second holes 134H may remain. In this embodiment, the second conductive layer may be formed in a relatively low-temperature atmosphere, whereby the second domain 134D2 may be prevented from deteriorating due to a relatively high-temperature deposition atmosphere.

Figure 10B:
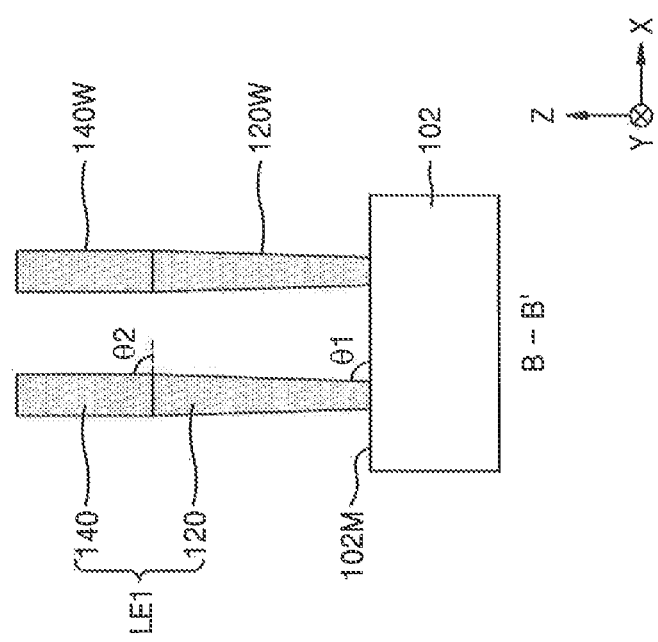
Figure 10A:
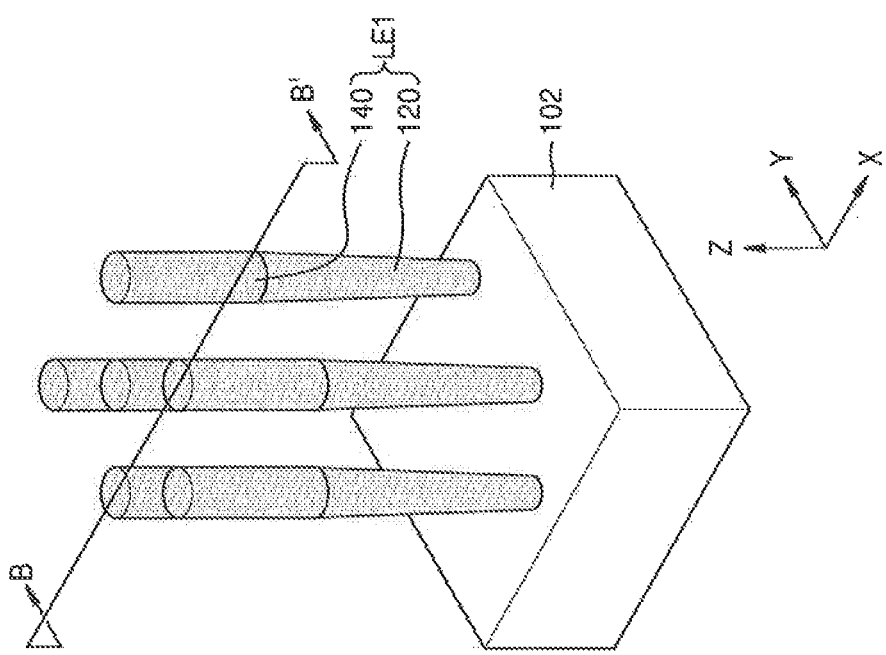

Referring to FIGS. 10A-10B, the inorganic oxide layer 134B, the inorganic oxide liner 132B, and the mold layer 110 are removed from the device shown in FIGS. 9A-9B, thereby exposing an outer sidewall of each of the plurality of first conductive patterns 120 and an outer sidewall of each of the plurality of second conductive patterns 140.

In some exemplary embodiments, each of the inorganic oxide layer 1348, the inorganic oxide liner 132B, and the mold layer 110 may include a silicon oxide-based material. In this embodiment, the inorganic oxide layer 134B, the inorganic oxide liner 132B, and the mold layer 110 may be simultaneously removed by using the same etchant. In some exemplary embodiments, to remove the inorganic oxide layer 134B, the inorganic oxide liner 132B, and the mold layer 110, a lift-off process using an UAL cleaning solution that includes ammonium fluoride ($NH_4F$), hydrofluoric acid (HF), and water may be performed.

In other exemplary embodiments in which the process of oxidizing the second domain 34D2 is omitted, the plurality of second conductive patterns 140 may be formed to respectively fill the plurality of second holes 134H in the device of FIGS. 7A-7B. In this embodiment, the outer sidewall of each of the plurality of second conductive patterns 140 may be covered with the second domain 134D2 and the brush liner 132. In this embodiment, to expose the outer sidewall of each of the plurality of first conductive patterns 120 and the outer sidewall of each of the plurality of second conductive patterns 140, the second domain 134D2, the brush liner 132, and the mold layer 110 may be removed in this order. For example, the outer sidewall of each of the plurality of second conductive patterns 140 and the top surface of the mold layer 110 may be exposed by removing the second domain 134D2 and the brush liner 132, followed by the exposing of the outer sidewall of each of the plurality of first conductive patterns 120 by removing the mold layer 110.

Each of the plurality of lower electrodes LE1 may include a stack structure in which a first conductive pattern 120 and a second conductive pattern 140 may be stacked on the substrate 102 in the vertical direction (Z direction) in this order. The first conductive pattern 120 which is closer to the substrate 102 than the second conductive pattern 140, may have a first outer sidewall 120W having the first tilt angle θ1 with respect to a plane parallel to the main surface 102M of the substrate 102. The second conductive pattern 140 is positioned farther from the substrate 102 and may have a second outer sidewall 140W having the second tilt angle θ2 with respect to a plane parallel to the main surface 102M of the substrate 102. The second tilt angle θ2 may be greater than the first tilt angle θ1. Therefore, in the case where the plurality of lower electrodes LE1 are formed to be arranged at a relatively high density on a relatively small cell area on the substrate 102, a sufficient separation distance between lower electrodes LE1 adjacent to each other may be secured in respective upper portions of the plurality of lower electrodes LE1 even though an aspect ratio of each of the plurality of lower electrodes LE1 is relatively high. Since a vertical (Z-direction) length of each lower electrode LE1 may be increased by a vertical (Z-direction) length of the second conductive pattern 140 from a vertical (Z-direction) length of the first conductive pattern 120, there may be an increase in capacitance of a capacitor including the lower electrodes LE1.

Figure 11:
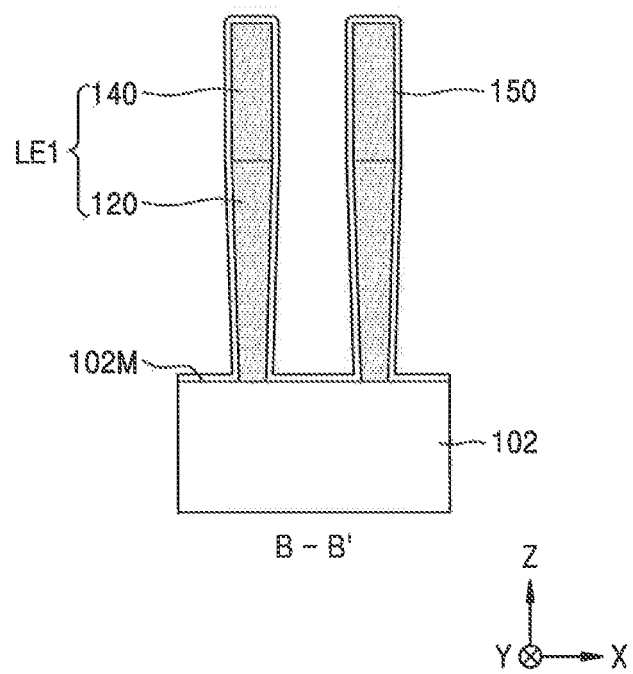
FIGS. 11 and 12 are cross-sectional views taken along line B-B', illustrating processes of a method of fabricating an integrated circuit device according to exemplary embodiments of the present inventive concept.

Referring to FIG. 11, a dielectric film 150 may be formed on the plurality of lower electrodes LE1. The dielectric, film 150 may be formed to conformally cover surfaces of the plurality of lower electrodes LE1 and surfaces of the substrate 102.

The dielectric film 150 may include nitride, oxide, a metal oxide, or a combination thereof. For example, the dielectric film 150 may have a single-layered or multi-layered structure including silicon nitride, silicon oxide, a metal oxide such as $HfO_2$, $ZrO_2$, $Al_2O_3$, $La_2O_3$, $Ta_2O_3$, or $TiO_2$, a Perovskite-structure dielectric material such as $SrTiO_3$ (STO), $(Ba,Sr)TiO_3$ (BST), $BaTiO_3$, PZT, or PLZT, or a combination thereof. In exemplary embodiments, the dielectric film 150 may have a thickness of about 50 Å to about 150 Å, without being limited thereto. In exemplary embodiments, the dielectric film 150 may be formed by a CND, PVD, or ALD process.

Figure 12:
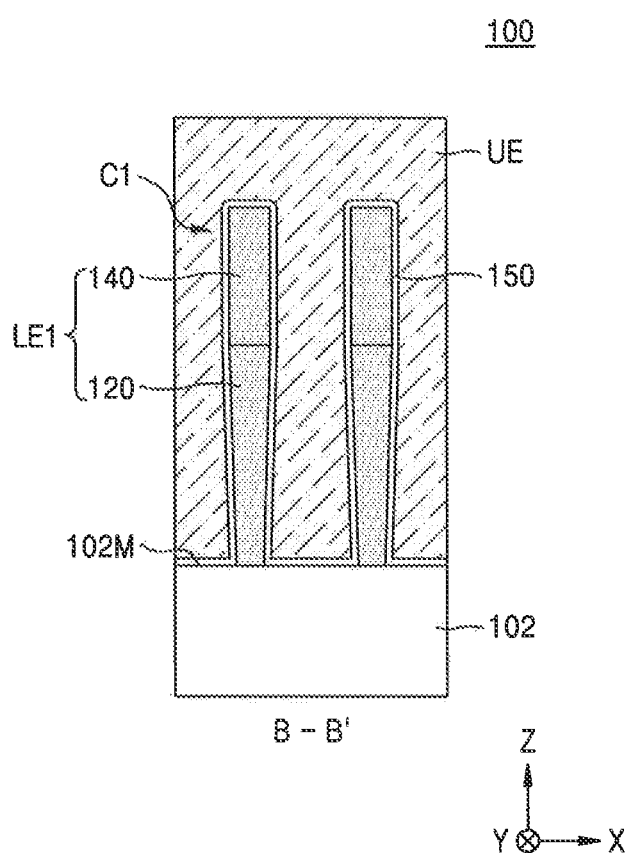

Referring to FIG. 12, an upper electrode UE may be formed on the dielectric film 150. This results in the formation of an integrated circuit device 100 including a capacitor C1 that includes each lower electrode LE1, the dielectric film 150, and the upper electrode UE.

In exemplary embodiments, the upper electrode UE may be formed to face the plurality of first conductive patterns 120 and the plurality of second conductive patterns 140 with the dielectric film 150 therebetween.

The upper electrode may include a doped semiconductor, a conductive metal nitride, a metal, a metal silicide, a conductive oxide, or a combination thereof. For example, although the upper electrode UP may include TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$(LSCo), or a combination thereof a constituent material of the upper electrode UE is not limited to the examples set forth above. In exemplary embodiments, a CVD, MOCVD, PVD, or ALD process may be used to form the upper electrode UE.

Although the method of fabricating the integrated circuit device 100 including the capacitor C1 that includes the lower electrode LE1 of a pillar type has been described with reference to FIGS. 1A to 12, integrated circuit devices having various structures may be fabricated by making various modifications and changes from the descriptions given with reference to FIGS. 1A to 12 without departing from the spirit and scope of the inventive concept. For example, instead of the lower electrode LE1 of a pillar type, a lower electrode of a cylinder type having an empty space therein may be formed. To form the lower electrode of a cylinder type, in the process described with reference to FIGS. 5A-5B, instead of the first conductive pattern 120 of a pillar type, a first conductive pattern of a cylinder type may be formed. In addition, in the process described with reference to FIGS. 9A-9B, instead of the second conductive pattern 140 of a pillar type, a second conductive pattern of a cylinder type, which has an end contacting a top surface of the first conductive pattern of a cylinder type, may be formed.

According to the exemplary embodiments of the method of fabricating the integrated circuit device 100, which has been described with reference to FIGS. 1 to 12, to improve the capacitance of the capacitor C1, the vertical height of each lower electrode LE1 may be increased by a self-assembly process. In this embodiment, since the self-assembly process is used to increase the vertical height of each lower electrode LE1, a sufficient separation distance between the lower electrodes LE1 adjacent to each other may be secured in the respective upper portions of the plurality of lower electrodes LE1 even though the aspect ratio of each of the plurality of lower electrodes LE1 is relatively high, whereby an insulation margin between the adjacent lower electrodes LE1 may be secured. Therefore, the capacitance of the capacitor C1 may be effectively improved within a relatively small cell area on the substrate 102. The electrical properties of the capacitor C1 and the reliability of the integrated circuit device 100 may be improved.

Figure 13A:
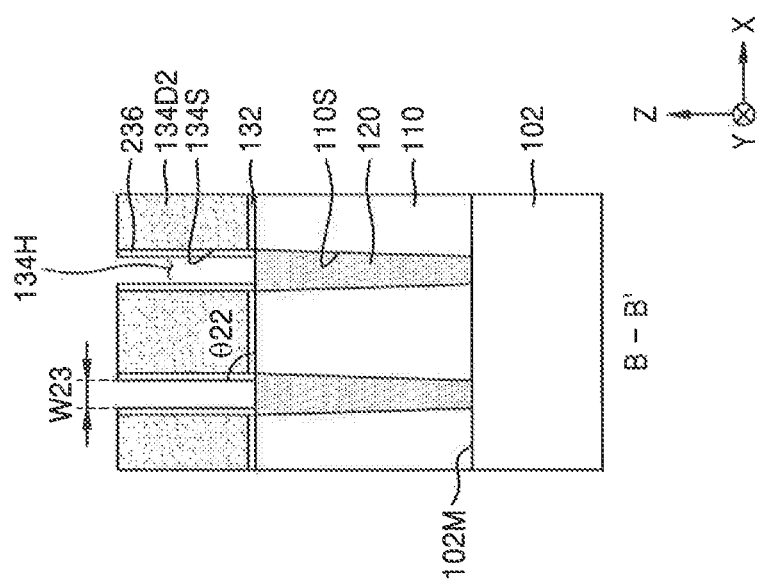
FIGS. 13A, 14A and 15A are perspective views illustrating processes of a method of fabricating an integrated circuit device according to alternative exemplary embodiments of the present invention.
Figure 13B:
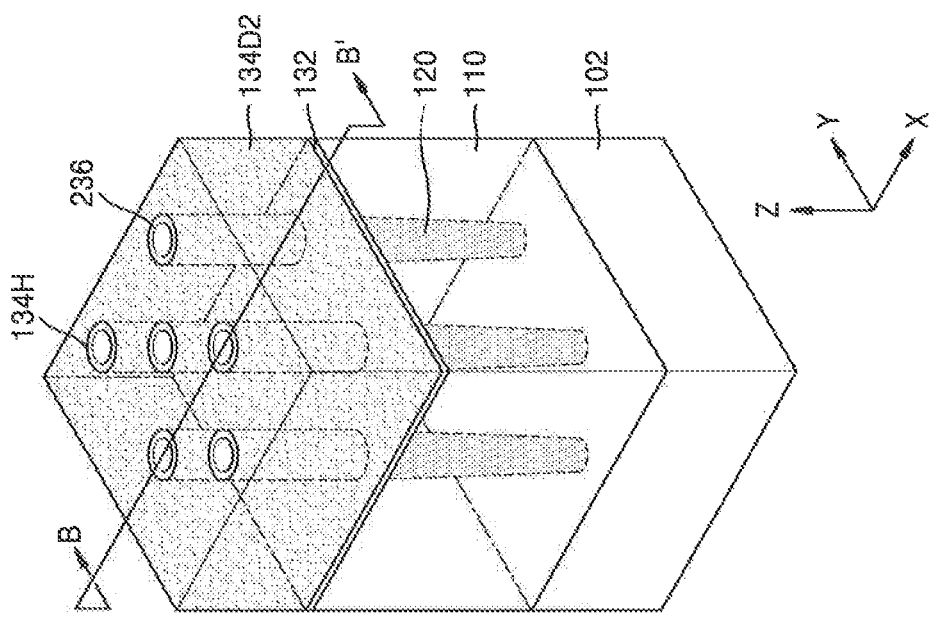
FIGS. 13B, 14B and 15B are cross-sectional views taken along line B-B in FIGS. 13A, 14A and 15A, respectively, of a method of fabricating an integrated circuit device according to alternative exemplary embodiments of the present invention.

Referring to FIGS. 13A-13B, in other exemplary embodiments, the plurality of first domains 134D1 of the self-assembly layer 134A may be removed from the device shown in FIGS. 6A-6B. A plurality of protective spacers 236 are then formed to cover second inner walls 134S of the plurality of second holes 134H.

In some exemplary embodiments, the plurality of protective spacers 236 may include the same material as a constituent material of the mold layer 110. For example, each of the plurality of protective spacers 236 may include a silicon oxide film.

In an exemplary embodiment of the method of forming the plurality of protective spacers 236, a protective insulating film may be formed to a uniform thickness to conformally cover exposed surfaces of the second domain 134D2 in the device of FIGS. 7A-7B obtained by removing the plurality of first domains 134D1. An etch-hack of the protective insulating film may then be performed to form the plurality of protective spacers 236, including the portions of the protective insulating film which cover sidewalls of the second domain 134D2 in the plurality of second holes 134H. After the plurality of protective spacers 236 are formed, top surfaces of the plurality of first conductive patterns 120 may be exposed by the plurality of second holes 134H defined by the plurality of protective spacers 236.

In some exemplary embodiments, each of the plurality of protective spacers 236 may be formed to a thickness of about 2 nm to about 15 am to cover the second inner wall 134S of each second hole 134H, without being limited thereto.

A sidewall of each protective spacer 236, which is exposed by each of the plurality of second holes 134H, may have a second tilt angle $\theta 22$ with respect to a plane parallel to the main surface 102M of the substrate 102. In an exemplary embodiment, the second tilt angle $\theta 22$ may be greater than the first tilt angle $\theta 1$ and may be closer to the vertical direction (Z direction) than the first tilt angle $\theta 1$. In some exemplary embodiments, the sidewall of each protective spacer 236, which is exposed by each of the plurality of second holes 134H may be approximately perpendicular to a plane parallel to the main surface 102M of the substrate 102.

After the plurality of protective spacers 236 are respectively formed in the plurality of second holes 134H, the top (e.g., entrance) of each of the plurality of second holes 134H may have a width W23 defined by each protective spacer 236. The width W23 of the top (e.g., entrance) of each of the plurality of second holes 134H, which is defined by each protective spacer 236, may be less than the width W2 of the entrance of each of the plurality of first holes 110H described with reference to FIGS. 2A-2B.

Figure 14A:
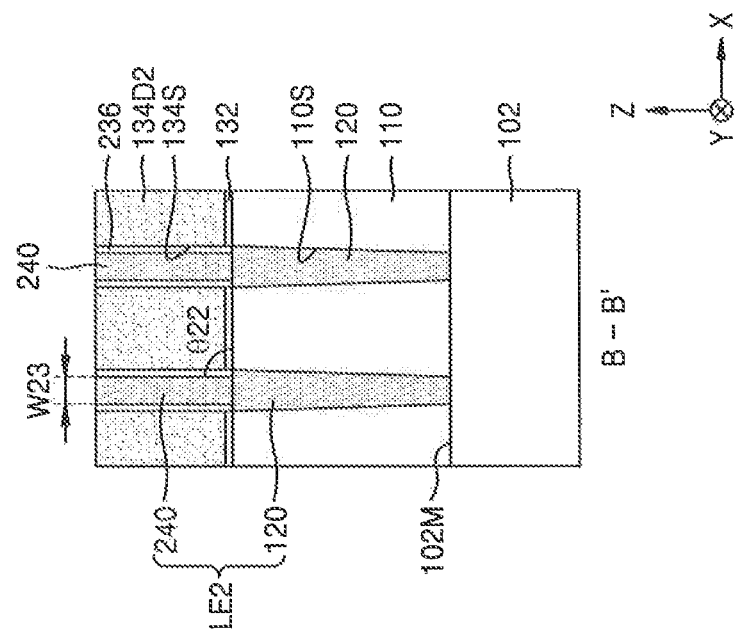
Figure 14B:
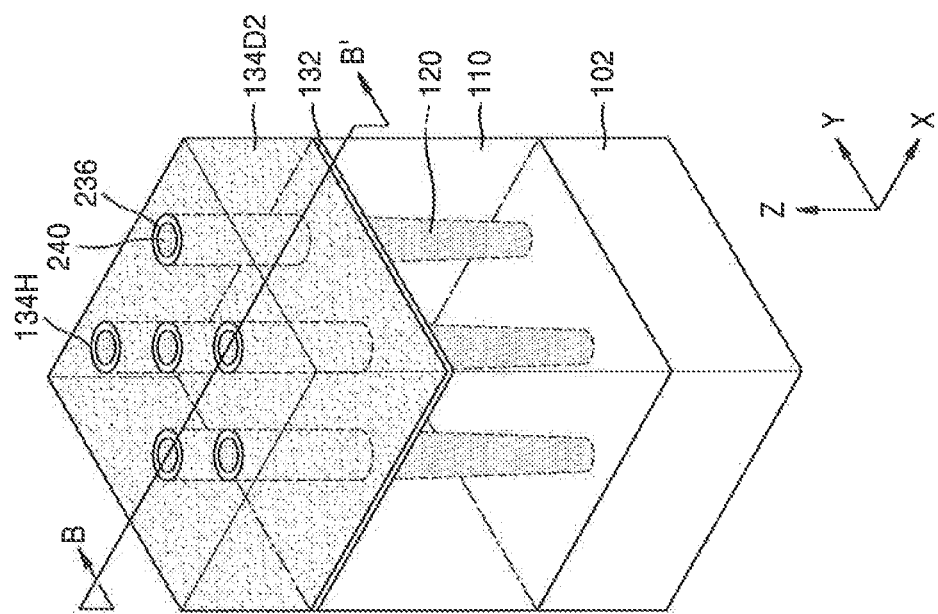

Referring to FIGS. 14A-14B, a plurality of second conductive patterns 240 may be formed in the plurality of second holes 134H respectively defined by the plurality of protective spacers 236.

The plurality of first conductive patterns 120 and the plurality of second conductive patterns 240 may constitute a plurality of lower electrodes LE2.

The plurality of second conductive patterns 240 may contact the top surfaces of the plurality of first conductive patterns 120. In a horizontal direction, for example, an X direction or a Y direction, a width of each of the plurality of second conductive patterns 240 may be less than a maximum width of each of the plurality of first conductive patterns 120.

For more description of a formation method and a constituent material regarding the plurality of second conductive patterns 240, reference may be made to the description of the plurality of second conductive patterns 140, which have been given with reference to FIGS. 9A-9B.

Figure 15B:
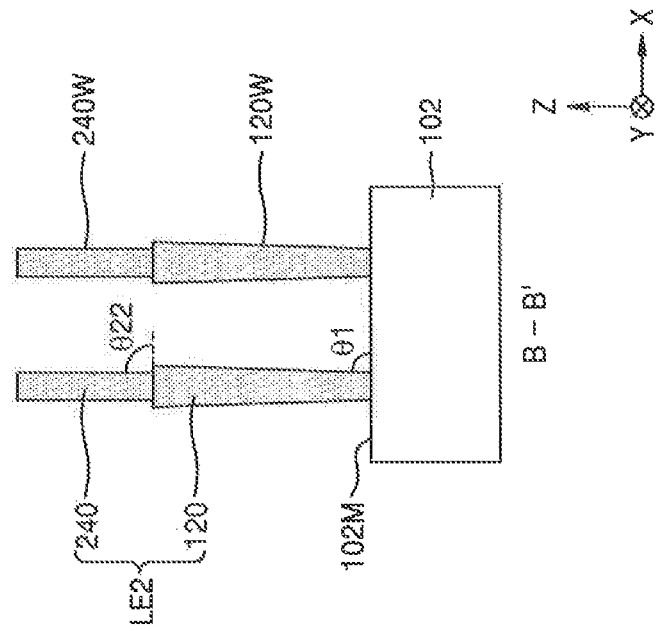
Figure 15A:
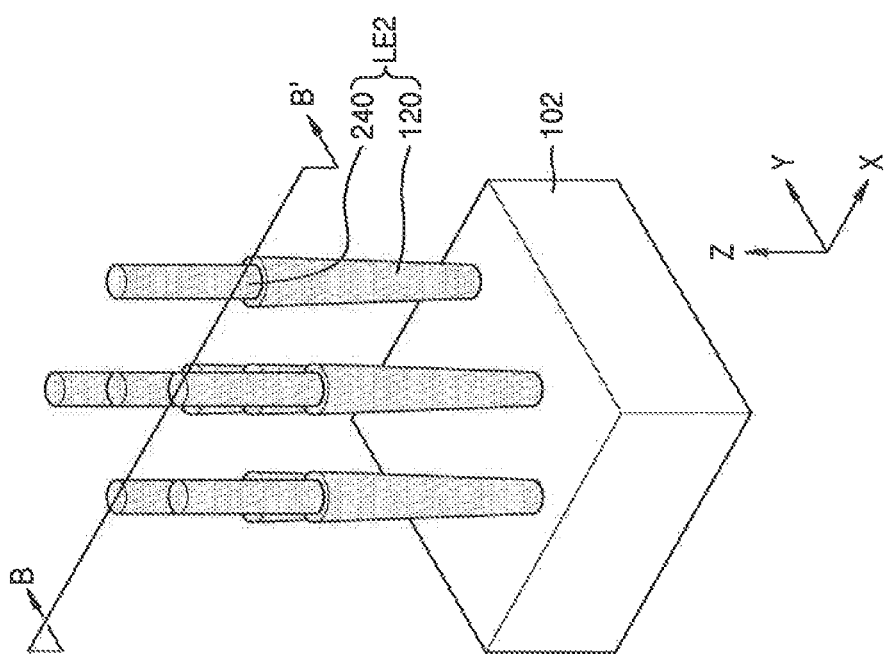

Referring to FIGS. 15A-15B, the second domain 134D2, the brush liner 132, the protective spacers 236, and the mold layer 110 may be removed from the device of FIGS. 14A-14B.

In some exemplary embodiments, the protective spacers 236 and the mold layer 110 may be exposed by first removing the second domain 134D2 and the brush liner 132 from the device of FIGS. 14A-14B. The protective spacers 236 and the mold layer 110 may then be simultaneously removed.

The outer sidewall of each of the plurality of first conductive patterns 120 and an outer sidewall of each of the plurality of second conductive patterns 240 may be exposed after the second domain 134D2, the brush liner 132, the protective spacers 236, and the mold layer 110 are removed.

Each of the plurality of lower electrodes LE2 may include a stack structure in which the first conductive pattern 120 and the second conductive pattern 240 are stacked on the substrate 102 in the vertical direction (Z direction) in this order. The first conductive pattern 120 may be closer to the substrate 102 than the second conductive pattern 240. The first conductive pattern 120 may have the first outer sidewall 120W having the first tilt angle $\theta 1$ with respect to a plane parallel to the main surface 102M of the substrate 102. The second conductive pattern 240 may have a second outer sidewall 240W having the second tilt angle $\theta 22$ with respect to a plane parallel to the main surface 102M of the substrate 102, the second tilt angle $\theta 22$ being greater than the first tilt angle $\theta 1$. Therefore, in the case where the plurality of lower electrodes LE2 are formed to be arranged at a relatively high density on a relatively small cell area on the substrate 102, a sufficient separation distance between lower electrodes LE2 adjacent to each other may be secured in respective upper portions of the plurality of lower electrodes LE2 even though an aspect ratio of each of the plurality of lower electrodes LE2 is relatively high. Since a vertical (Z-direction) length of each lower electrode LE2 may be increased by a vertical (Z-direction) length of the second conductive pattern 240 from the vertical (Z-direction) length of the first conductive pattern 120, there may be an increase in capacitance of a capacitor including the lower electrodes LE2.

Figure 16:
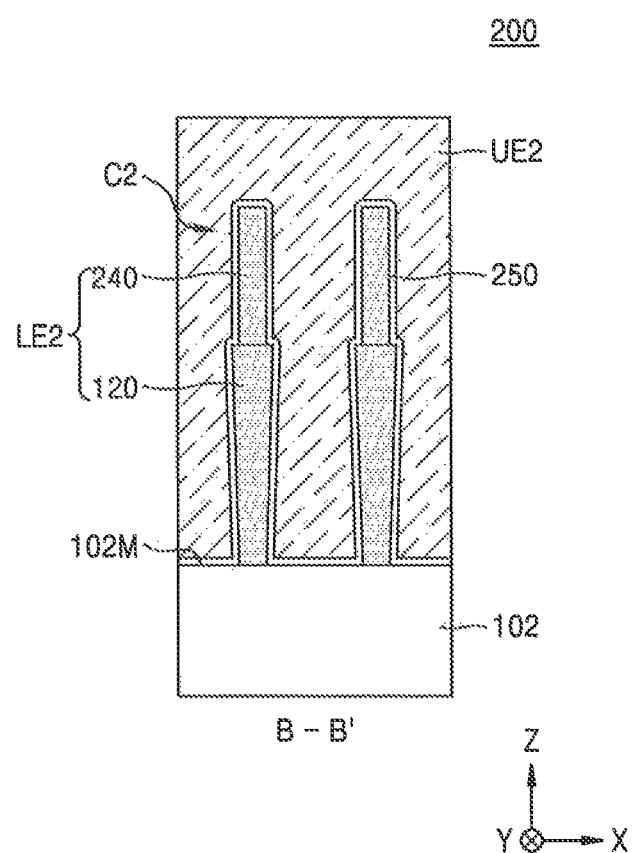
FIG. 16 is a cross-sectional view taken along line B-B', illustrating a method of fabricating an integrated circuit device according to an alternative exemplary embodiment of the present inventive concept.

Referring to FIG. 16, in a similar manner to that described with reference to FIGS. 11 and 12, a dielectric film 250 and an upper electrode UE2 may be formed on the plurality of lower electrodes LE2 in this order. As a result, an integrated circuit device 200 including a capacitor C2 that includes each lower electrode LE2, the dielectric film 250, and the upper electrode UE2 may be obtained.

For more description of the dielectric film 250 and the upper electrode UE2, reference may be made to the description of the dielectric film 150 and the upper electrode UE, which have been given with reference to FIGS. 11 and 12.

Although the method of fabricating the integrated circuit device 200 including the capacitor C1 that includes the lower electrode LE2 of a pillar type has been described with reference to FIGS. 13A to 16, integrated circuit devices having various structures may be fabricated by making various modifications and changes from the descriptions given with reference to FIGS. 13A to 16 without departing from the spirit and scope of the inventive concept. For example, instead of the lower electrode LE2 of a pillar type, a lower electrode of a cylinder type having an empty space therein may be formed.

According to the exemplary embodiments of the method of fabricating the integrated circuit device 200, which have been described with reference to FIGS. 13 to 16 according to embodiments, to improve the capacitance of the capacitor C2, the vertical height of each lower electrode LE2 may be increased by a self-assembly process. In this embodiment, since the self-assembly process is used to increase the vertical height of each lower electrode LE2, the sufficient separation distance between the lower electrodes LE2 adjacent to each other may be secured in the respective upper portions of the plurality of lower electrodes LE2 even though the aspect ratio of each of the plurality of lower electrodes LE2 is relatively high, whereby an insulation margin between the adjacent lower electrodes may be secured. Therefore, the capacitance of the capacitor C2 may be effectively improved within a relatively small cell area on the substrate 102, whereby electrical properties of the capacitor C2 and the reliability of the integrated circuit device 200 may be improved.

Figure 17:
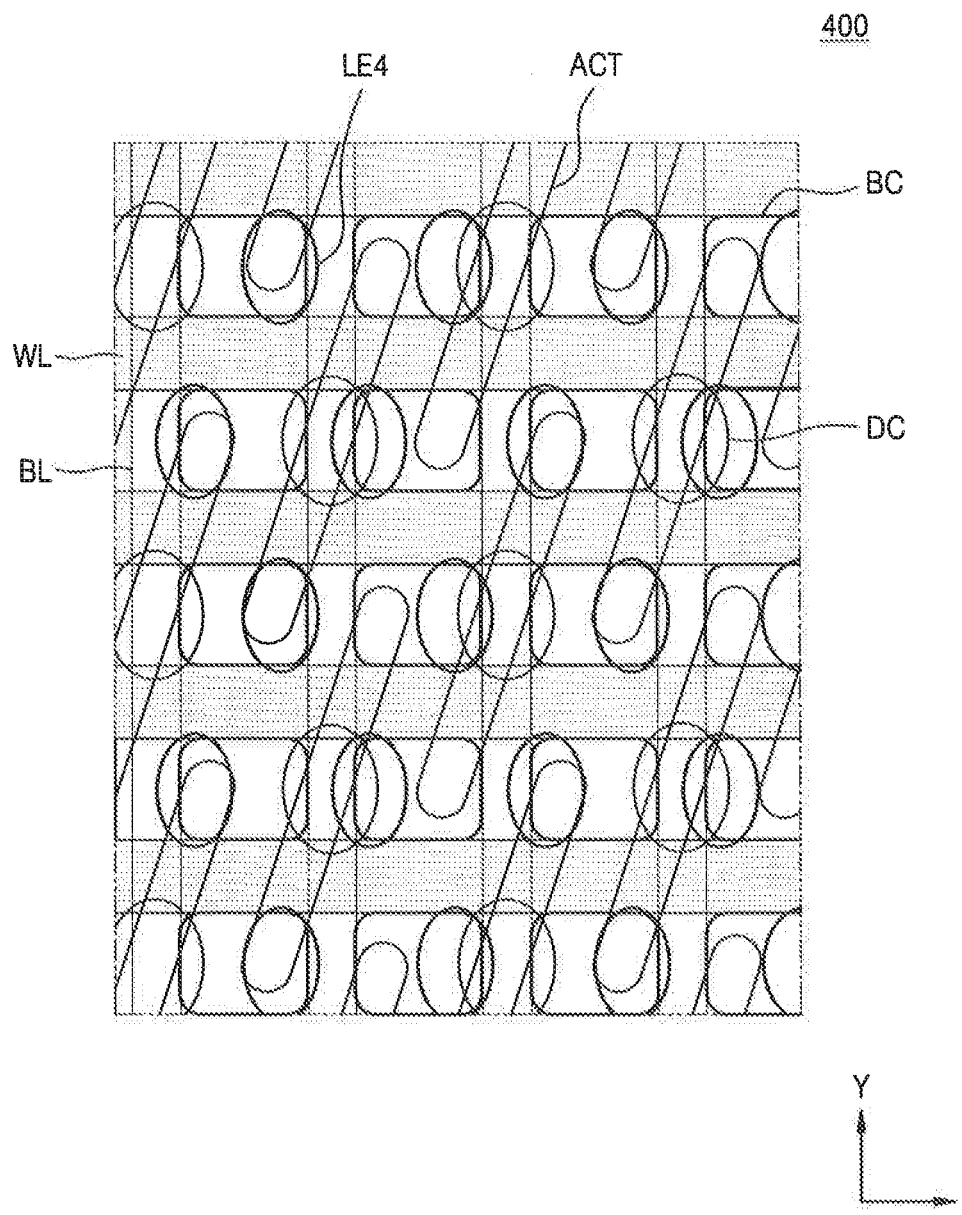
FIG. 17 is a schematic planar layout illustrating main components of a cell array area of an integrated circuit device according to exemplary embodiments of the present inventive concept.

FIG. 17 is a schematic planar layout illustrating main components of a cell array area of an integrated circuit device 400 that may be implemented by a method of fabricating an integrated circuit device, according to exemplary embodiments.

Referring to FIG. 17, the integrated circuit device 400 may include a plurality of active regions ACT. The plurality of active regions ACT may be arranged in an oblique direction with respect to the X direction and the Y direction.

A plurality of word lines WL may extend parallel to each other in the X direction across the plurality of active regions ACT. A plurality of bit lines BL may extend parallel to each other in the Y direction on the plurality of word lines WL. The plurality of bit lines BL may be connected to the plurality of active regions ACT via direct contacts DC.

A plurality of buried contacts BC may be formed between two adjacent bit lines BL of the plurality of hit lines BL. The plurality of buried contacts BC may be arranged in a line in each of the X direction and the Y direction.

A plurality of lower electrodes LE4 may be formed on the plurality of buried contacts BC. The plurality of lower electrodes LE4 may be connected to the plurality of active regions ACT via the plurality of buried contacts BC.

FIGS. 18A to 18K are cross-sectional views illustrating sequential processes of a method of fabricating the integrated circuit device 400 shown in FIG. 17, according to exemplary embodiments. In FIGS. 18A to 18K, the same reference numerals as in FIGS. 1A to 16 respectively denote the same members, and detailed descriptions thereof will be omitted.

Figure 18A:
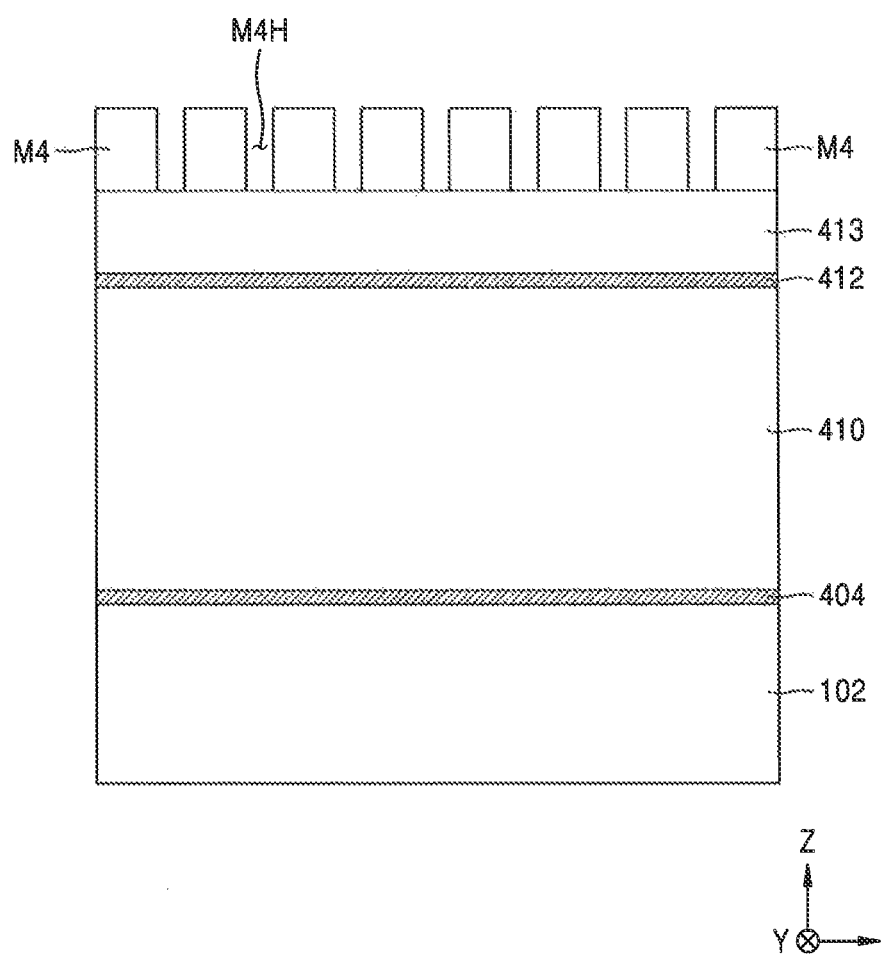
FIGS. 18A to 18K are cross-sectional views illustrating processes of a method of fabricating the integrated circuit device shown in FIG. 17 according to exemplary embodiments of the present inventive concept.

Referring to FIG. 18A, an etch stop layer 404, a mold layer 410, a first support layer 412, and a sacrificial layer 413 may be formed on the substrate 102 in this order. A mask pattern M4 may then be formed on the sacrificial layer 413, the mask pattern M4 having a plurality of holes M4H.

The plurality of active regions ACT and a plurality of conductive regions may be formed in the substrate 102.

In some exemplary embodiments, the etch stop layer 404 may include silicon nitride, silicon oxynitride, or a combination thereof mold layer 410 may include silicon oxide. The first support layer 412 may include silicon nitride, silicon carbonitride, tantalum oxide, titanium oxide, or a combination thereof. The sacrificial layer 413 may include borophosphosilicate glass (BPSG), phosphosilicate glass (PSG), undoped silicate glass (USG), spin-on dielectric (SOD), or oxide formed by a high-density plasma (HDP) CVD process. However, the materials set forth above are merely examples, and the inventive concept is not limited thereto. In addition, although a configuration in which one first support layer 412 is arranged on the mold layer 410, is shown in the present exemplary embodiment, the mold layer 410 may include a plurality of partial mold layers, and at least one intermediate support layer arranged between the plurality of partial mold layers may be further provided.

A top surface of the sacrificial layer 413 may be exposed by the plurality of holes M4H formed in the mask pattern M4. The plurality of holes M4H may form a hexagonal array in which the plurality of holes M4H are regularly arranged at regular pitches. The mask pattern M4 may include at least one layer that may be used as an etch mask in patterning the etch stop layer 404, the mold layer 410, the first support layer 412, and the sacrificial layer 413. For example, the mask pattern M4 may include a polysilicon film, a silicon oxide film, a SiCN film, a carbon-containing film including a spin-on hardmask (SOH) material, or a combination thereof. In an exemplary embodiment, the carbon-containing film including the SOH material may include an organic compound having a relatively high carbon content of about 85% by weight (wt %) to about 99 wt % based on the total weight thereof. The organic compound may include an aromatic ring-containing hydrocarbon compound or a derivative thereof.

Figure 18B:
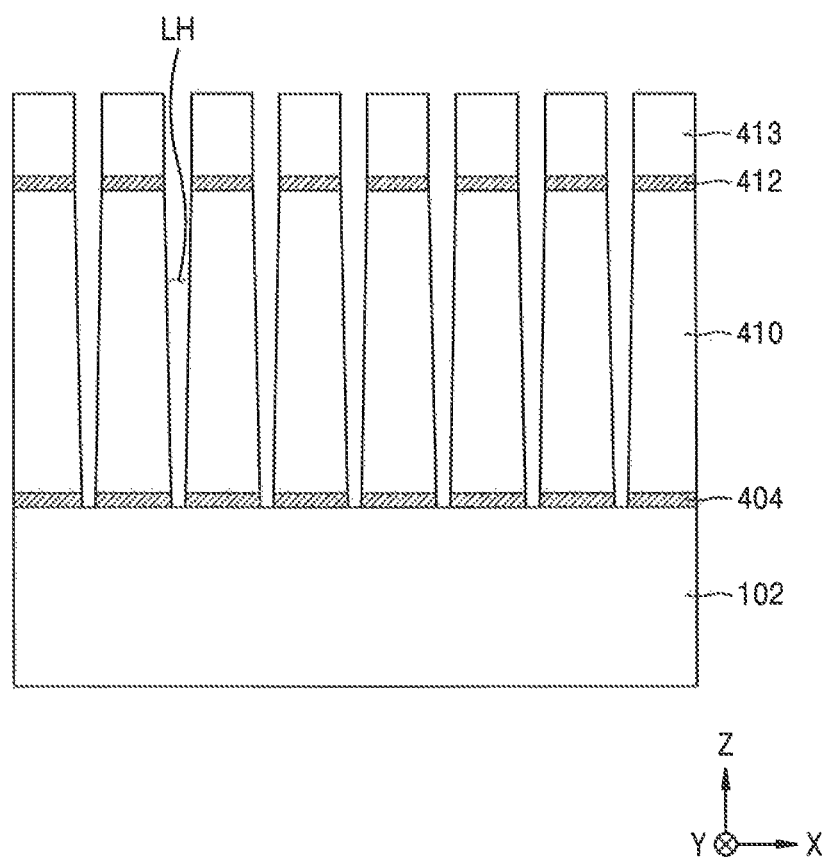

Referring to FIG. 18B, the sacrificial layer 413, the first support layer 412, and the mold layer 410 may be etched in the device of FIG. 18A in this order by using the mask pattern M4 as an etch mask and using the etch stop layer 404 as an etch end point. The etch stop layer 404 may be consecutively etched by over-etch, thereby forming a plurality of lower electrode holes LH, which expose a plurality of conductive regions in the substrate 102. The top surface of the sacrificial layer 413 may then be exposed by removing the mask pattern M4.

Figure 18C:
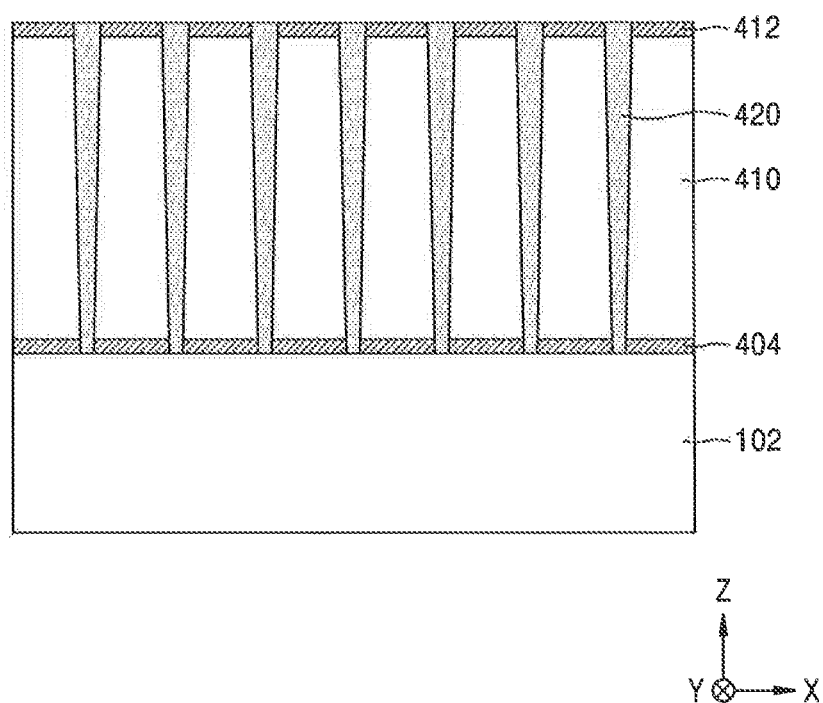

Referring to FIG. 18C, a lower electrode-forming conductive film is formed to cover the top surface of the sacrificial layer 413 and simultaneously fill an inside of each of the plurality of lower electrode holes LH. An upper portion of the lower electrode-forming conductive film and the sacrificial layer 413 may then be removed by an etch-hack process or a chemical mechanical polishing (CMP) process such that a top surface of the first support layer 412 is exposed to form a plurality of first conductive patterns 420, which fill the insides of the plurality of lower electrode holes LH. A more detailed description of the plurality of first conductive patterns 420 has been provided with reference to FIGS. 3A-3B.

After the plurality of first conductive patterns 420 are formed, a native oxide film remaining on a surface of the first support layer 412 may be removed by using oxygen plasma and a cleaning process. As a result, an —OH group may be exposed at the surface of the first support layer 412. However, exposed surfaces of the plurality of first conductive patterns 420 may not include —OH groups.

Figure 18D:
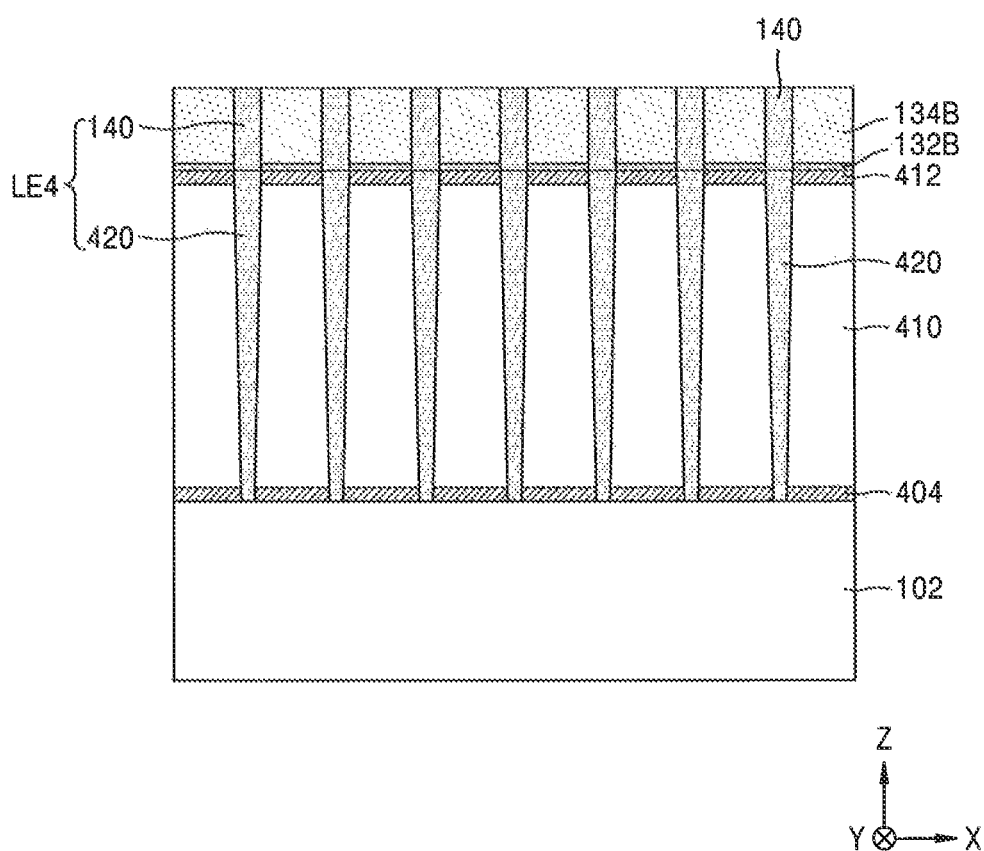

Referring to FIG. 18D, the same processes as described with reference to FIGS. 4A-9B are performed on the device shown in FIG. 18C, thereby forming the inorganic oxide liner 132B and the inorganic oxide layer 134B, which cover the first support layer 412 in this order. The plurality of second conductive patterns 140 are also formed which cover the plurality of first conductive patterns 420.

The plurality of first conductive patterns 420 and the plurality of second conductive patterns 140 may constitute the plurality of lower electrodes LE4.

Figure 18E:
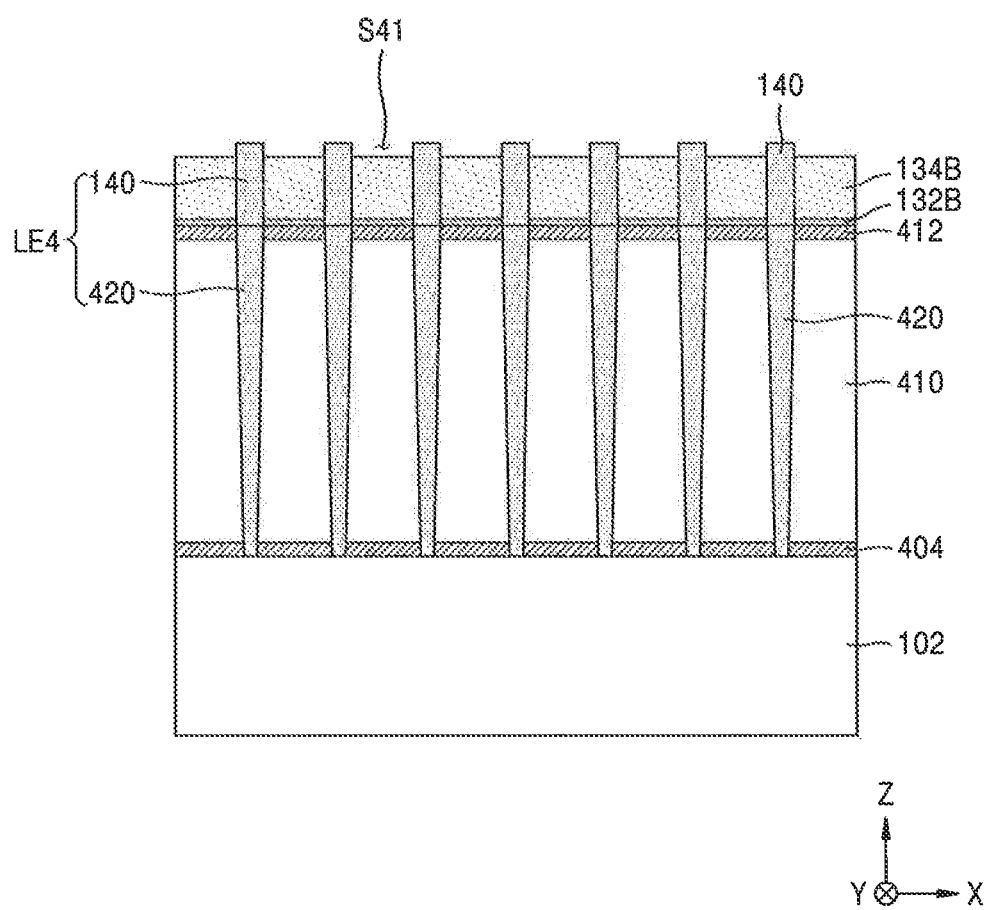

Referring to FIG. 18E, the inorganic oxide layer 134B may be partially removed from an upper portion thereof, thereby forming a support space S41, which exposes an upper outer sidewall of each of the plurality of second conductive patterns 140.

In some exemplary embodiments, to form the support space S41, a portion of the inorganic oxide layer 134B may be anisotropically dry-etched.

Figure 18F:
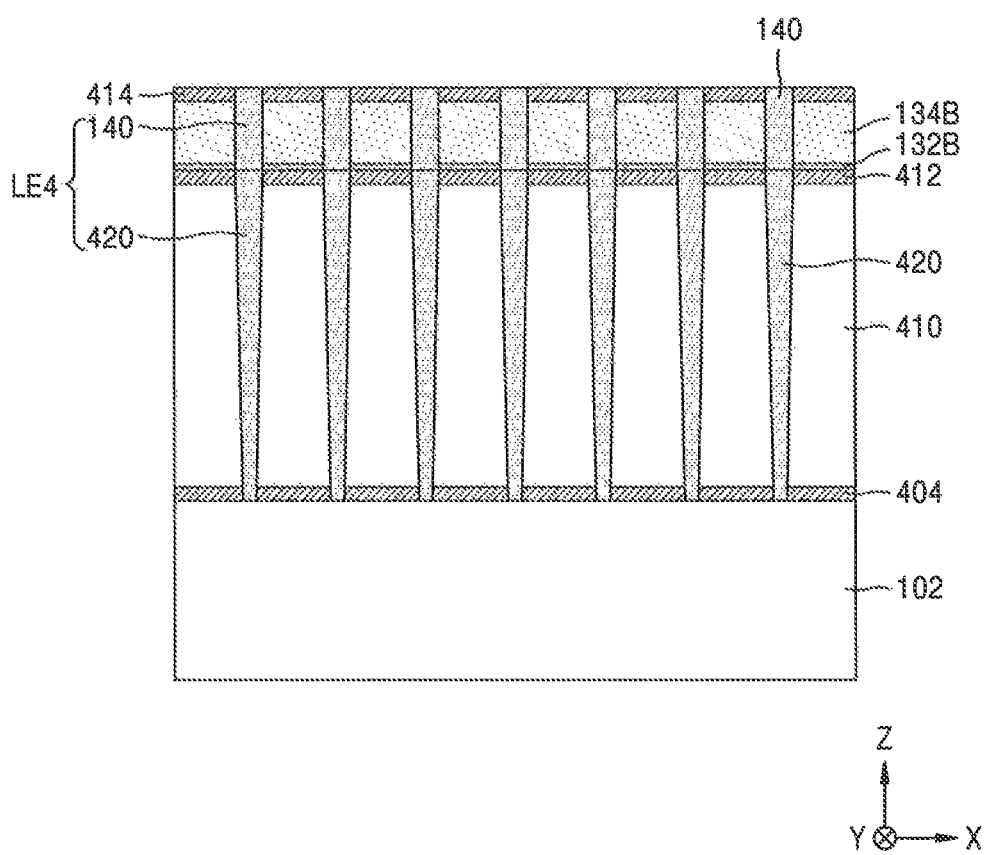

Referring to FIG. 18F, a second support layer 414 may be formed to fill the support space S41 shown in the device of FIG. 18E.

The second support layer 414 may include silicon nitride, silicon carbonitride, tantalum oxide, titanium oxide, or a combination thereof. In some exemplary embodiments, the first support layer 412 and the second support layer 414 may include the same material.

Figure 18G:
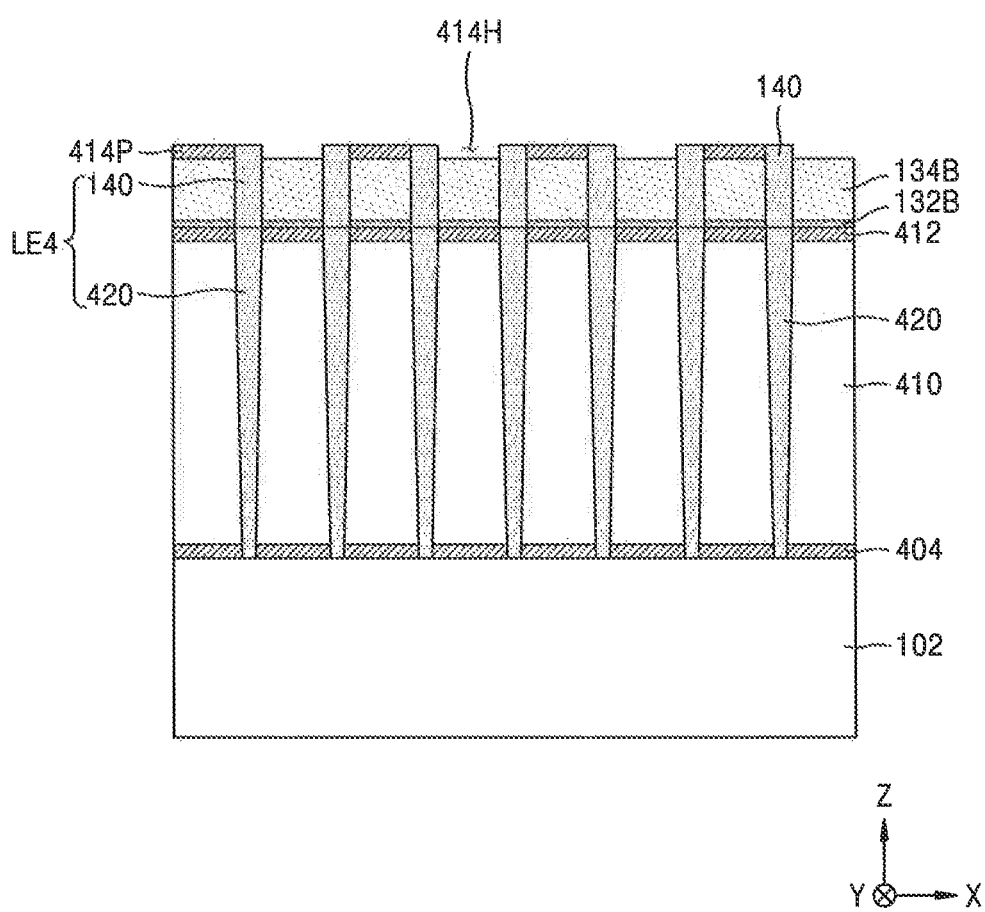

Referring to FIG. 18G, the second support layer 414 may then be partially removed from the device shown in FIG. 18F. A second support pattern 414P having a plurality of openings 414H is formed by the partial removal of the second support layer 414. Portions of the top surface of the inorganic oxide layer 134B may be exposed by the plurality of openings 414H formed in the second support pattern 414P.

Figure 18H:
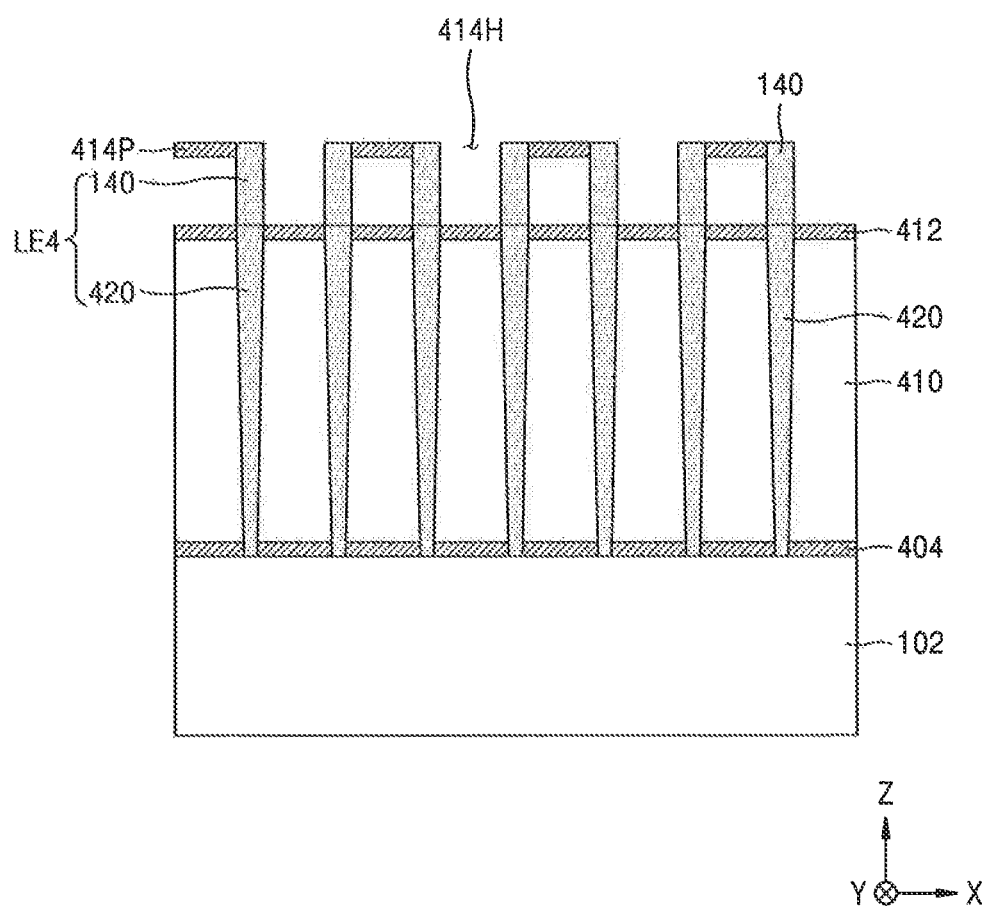

Referring to FIG. 18H, the inorganic oxide layer 134B and the inorganic oxide liner 132B may be removed through the plurality of openings 414H formed in the second support pattern 414P, thereby exposing the outer sidewall of each of the plurality of second conductive patterns 140 and the top surface of the first support layer 412.

Figure 18I:
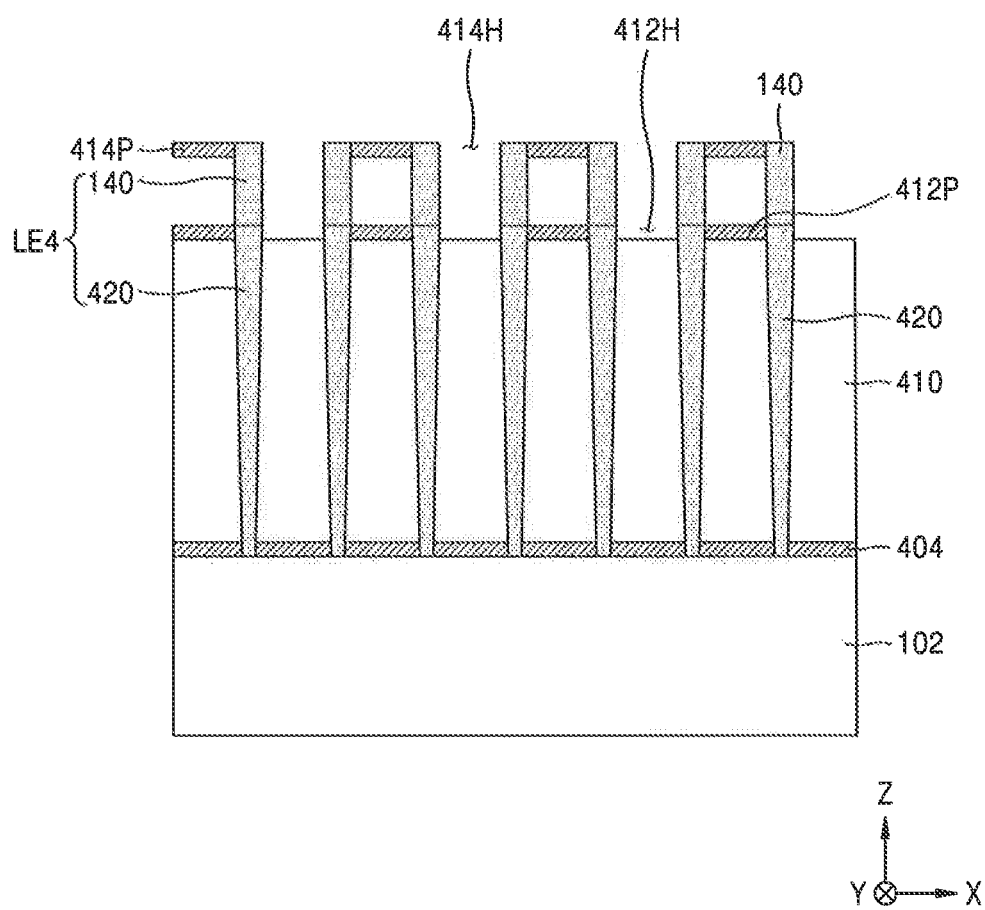

Referring to FIG. 18I, the first support layer 412 may be partially removed from the device of FIG. 18H, thereby forming a first support pattern 412P having a plurality of openings 412H. Portions of a top surface of the mold layer 410 may be exposed by the plurality of openings 412H formed in the first support pattern 412P.

Figure 18J:
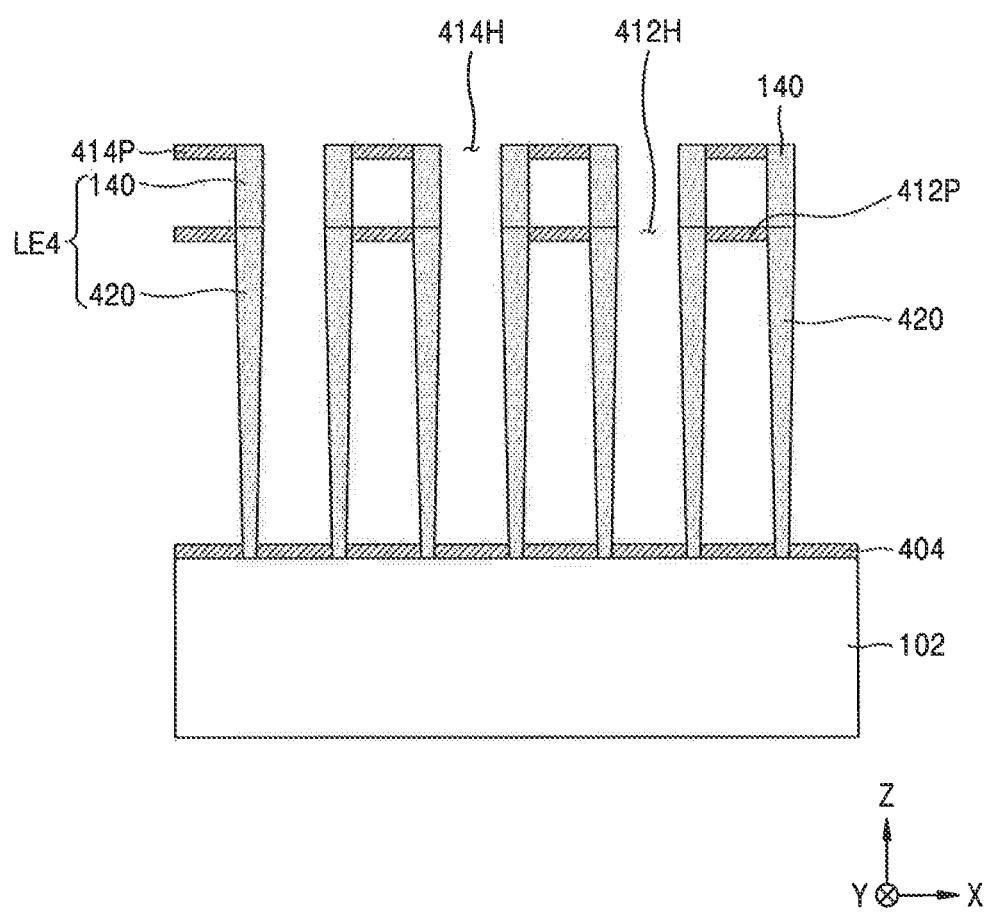

Referring to FIG. 18J, the mold layer 410 may be removed through the plurality of openings 412H formed in the first support pattern 412P, thereby exposing an outer sidewall of each of the plurality of first conductive patterns 420 and a top surface of the etch stop layer 404.

Although a configuration, in which one first support layer 412 is arranged on the mold layer 410 is shown in the present example, when the mold layer 410 includes a plurality of partial mold layers and at least one intermediate support layer arranged between the plurality of partial mold layers is further provided, a process of removing each of the partial mold layers constituting the mold layer 410 and a process of patterning the at least one intermediate support layer may be sequentially performed in top-to-bottom order such that the top surface of the etch stop layer 404 is exposed.

Figure 18K:
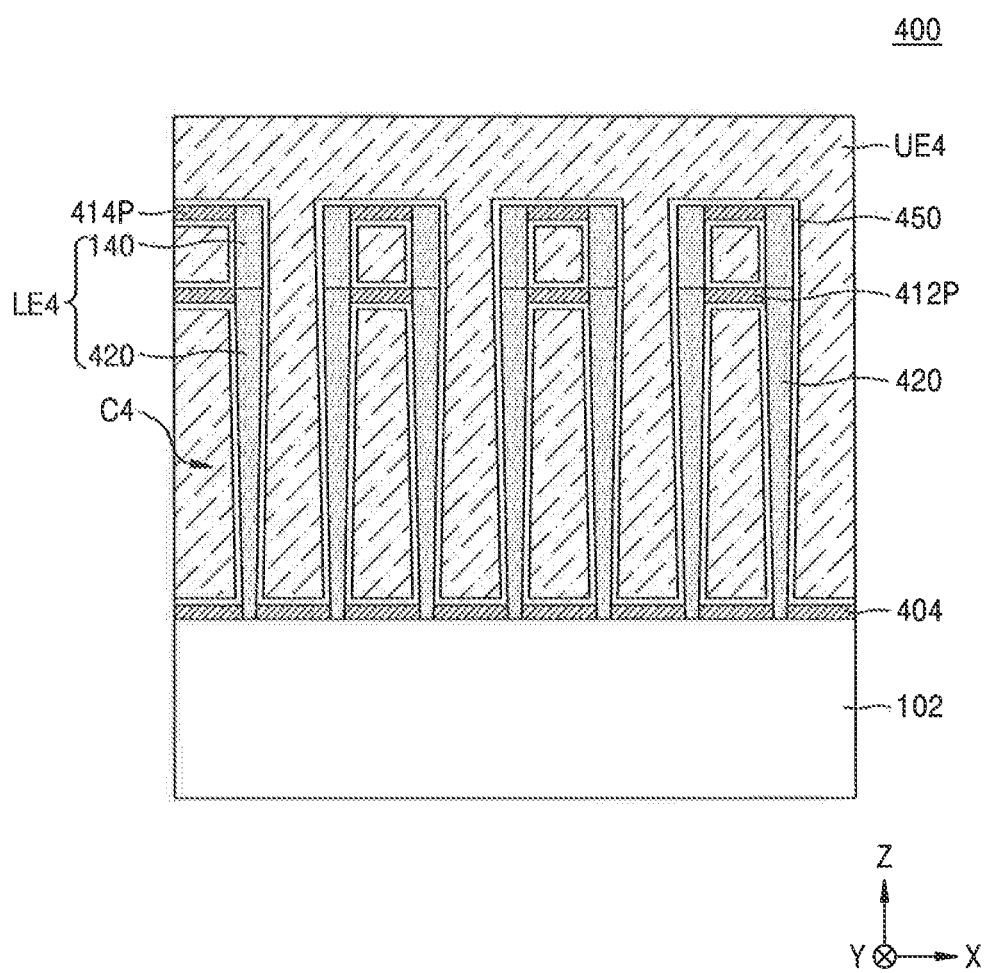

Referring to FIG. 18K, in a similar manner to that described with reference to FIGS. 11 and 12 regarding the formation of the dielectric film 150 and the upper electrode UE, a dielectric film 450 and an upper electrode UE4 are formed, in this order on the plurality of lower electrodes LE4 including the plurality of first conductive patterns 420 and the plurality of second conductive patterns 140. As a result, the integrated circuit device 400 including a capacitor C4 that includes each lower electrode LE4, the dielectric film 450, and the upper electrode UE4 may be obtained.

The dielectric film 450 may be formed to a uniform thickness to conformally cover the outer sidewall of each of the plurality of first conductive patterns 420, the outer sidewall of each of the plurality of second conductive patterns 140, the top surface of the etch stop layer 404, a surface of the first support pattern 412P, and a surface of the second support pattern 414P. For more description of the dielectric film 450 and the upper electrode UE4, reference may be made to the description of the dielectric film 150 and the upper electrode UE, which have been provided with reference to FIGS. 11 and 12.

Figure 19A:
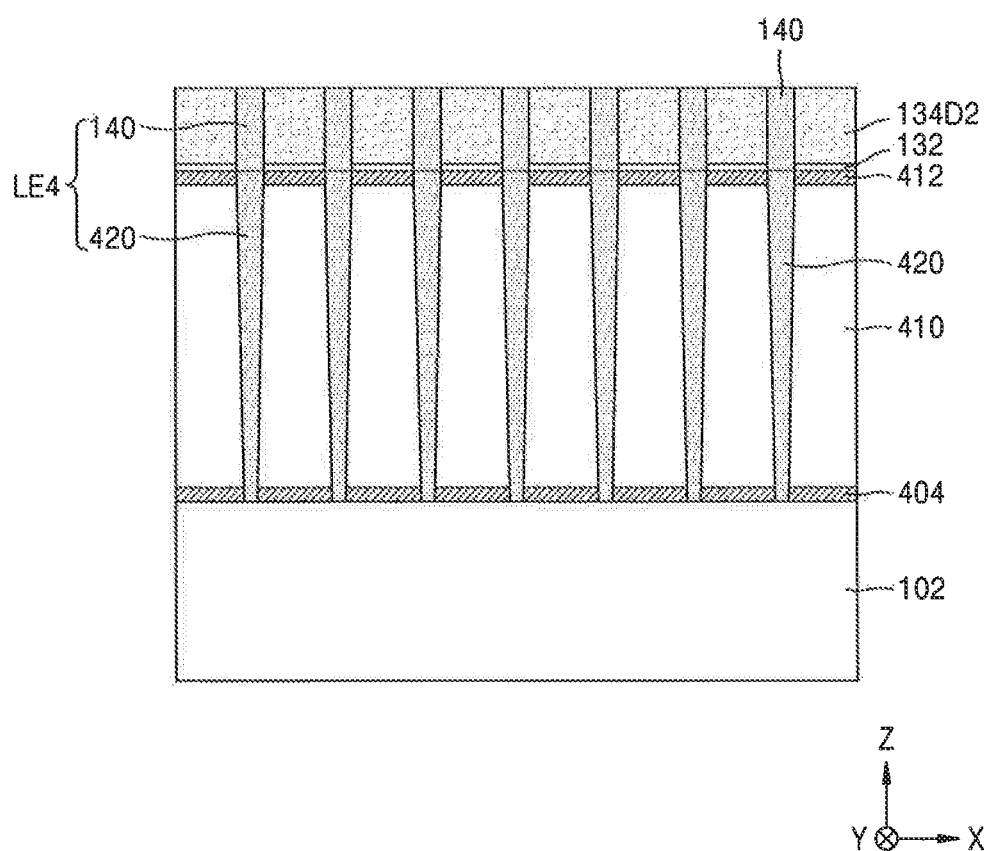
FIGS. 19A to 19C are cross-sectional views illustrating processes of another method of fabricating the integrated circuit device shown in FIG. 17 according to exemplary embodiments of the present inventive concept.
Figure 19B:
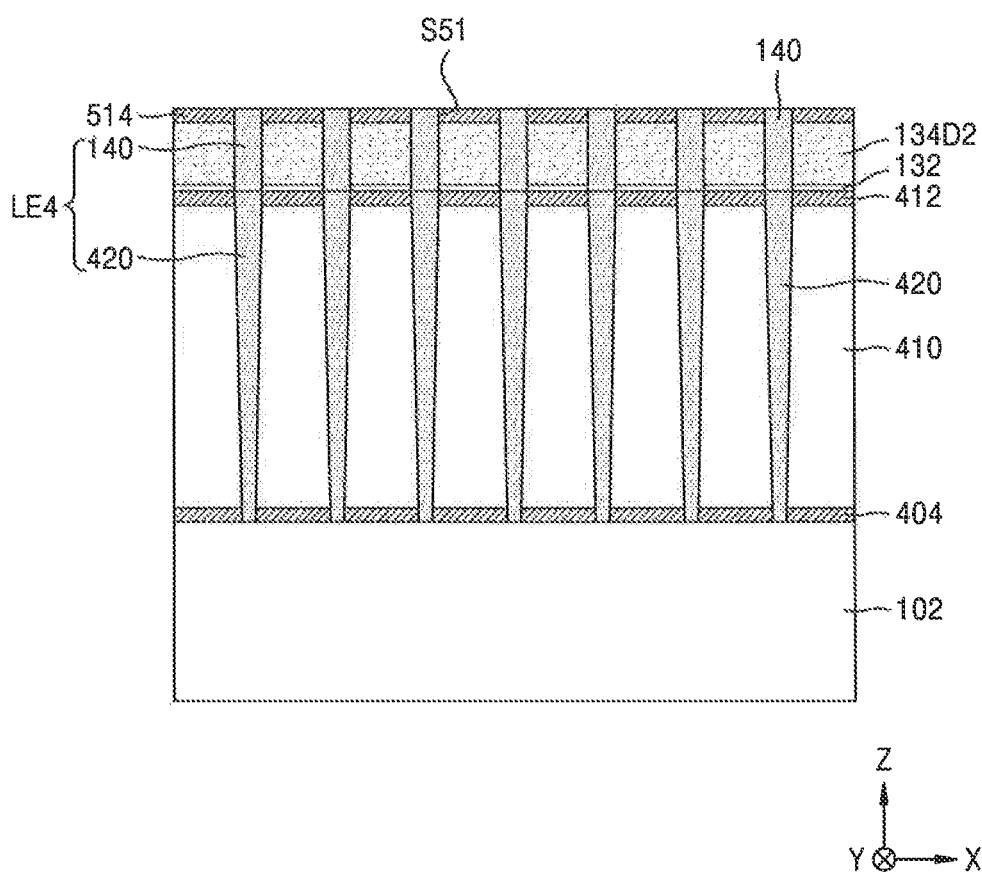
Figure 19C:
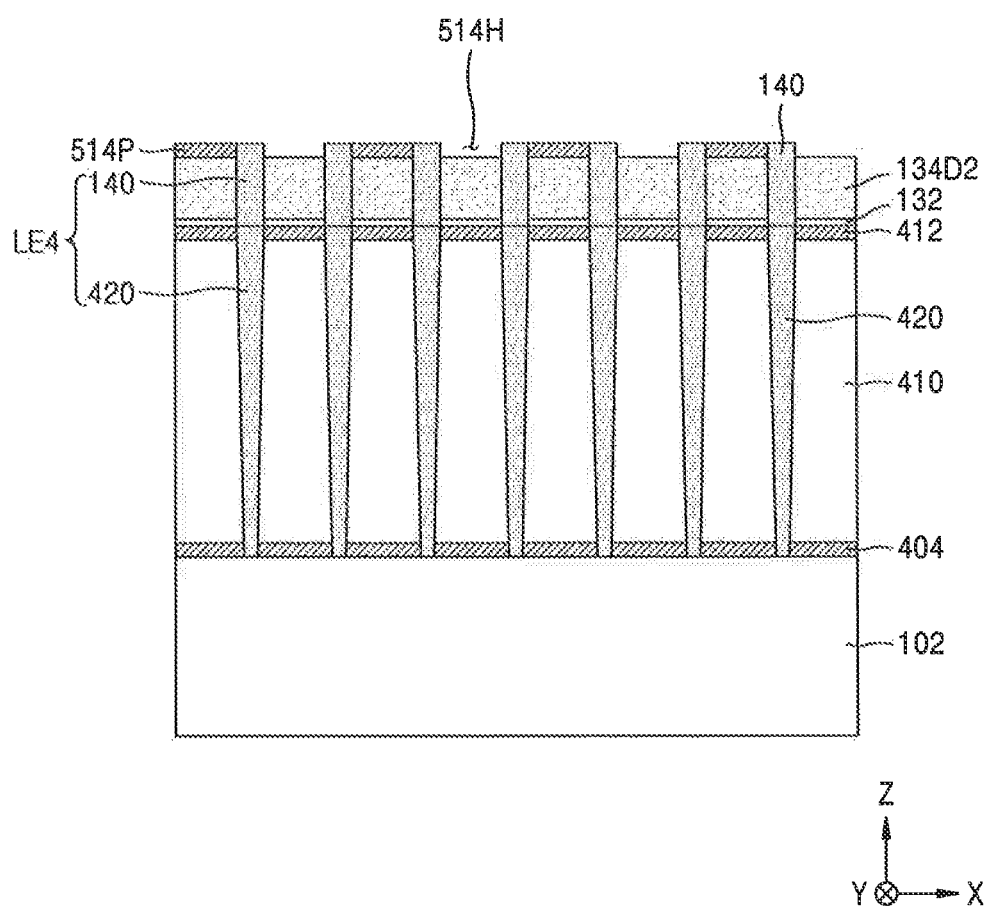

FIGS. 19A to 19C are cross-sectional views illustrating sequential processes of another method of fabricating the integrated circuit device 400 shown in FIG. 17, according to exemplary embodiments. In FIGS. 19A to 19C, the same reference numerals as in FIGS. 1 to 18K respectively denote the same members, and detailed descriptions thereof will be omitted.

Referring to FIG. 19A, in the same manner as described with reference to FIGS. 18A to 18C, the etch stop layer 404, the mold layer 410, and the first support layer 412 may be formed on the substrate 102 in this order. The plurality of first conductive patterns 420 are formed on the substrate 102 through these components. The brush liner 132 and the second domain 134D2, which cover the first support layer 412 in this order, and the plurality of second holes 134H, which penetrate the second domain 134D2, may then be formed by performing the same processes as described with reference to FIGS. 4A to 7B. The plurality of second conductive patterns 140 in the plurality of second holes 134H may then be formed in a similar manner to that described with reference to FIGS. 9A-9B. In this embodiment, the process of oxidizing the second domain 134D2, which has been described with reference to FIGS. 8A-8B, may be omitted.

Referring to FIG. 19B, a support space S51, which exposes the upper outer sidewall of each of the plurality of second conductive patterns 140 may be formed on the device shown in FIG. 19A by partially removing the second domain 134D2 from an upper portion thereof in a similar manner to that described with reference to FIG. 18E. A second support layer 514 may then be formed which fills the support space S51, in a similar manner to that described with reference to FIG. 18F. Detailed description of the second support layer 514 has been provided with reference to FIG. 18F.

Referring to FIG. 19C, in a similar manner to that described with reference to FIG. 18G, a second support pattern 514P having a plurality of openings 514H may be formed by partially removing the second support layer 514. Portions of the top surface of the second domain 134D2 may be exposed by the plurality of openings 514H formed in the second support pattern 514P.

The second domain 134D2 and the brush liner 132 may then be removed through the plurality of openings 514H formed in the second support pattern 514P, thereby exposing the outer sidewall of each of the plurality of second conductive patterns 140 and the top surface of the first support layer 412.

The same processes as described with reference to FIGS. 18I to 18K may then be performed, so that the first support pattern 412P having the plurality of openings 412H is formed, the mold layer 410 is removed through the plurality of openings 412H formed in the first support pattern 412P, and the dielectric film 450 and the upper electrode UE4 are formed, in this order, on the plurality of lower electrodes LE4 including the plurality of first conductive patterns 420 and the plurality of second conductive patterns 140, whereby the integrated circuit device 400 including the capacitor C4 that includes each lower electrode LE4, the dielectric film 450, and the upper electrode UE4 may be fabricated.

FIGS. 20A to 20E are cross-sectional views illustrating sequential processes of a method of fabricating an integrated circuit device, according to other exemplary embodiments. In FIGS. 20A to 20E, the same reference numerals as in FIGS. 1A to 19C respectively denote the same members, and detailed descriptions thereof will be omitted.

Figure 20A:
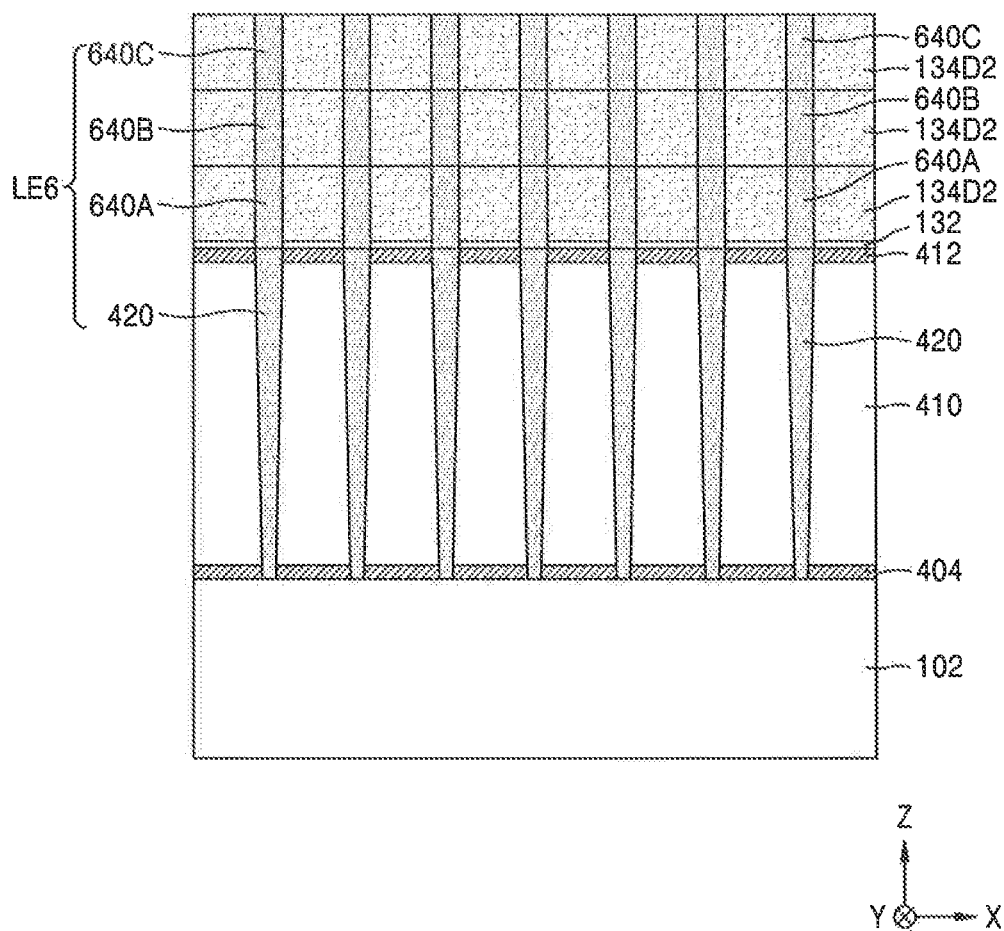
FIGS. 20A to 20E are cross-sectional views illustrating processes of a method of fabricating an integrated circuit device, according to other exemplary embodiments of the present inventive concept.

Referring to FIG. 20A, in the same manner as described with reference to FIGS. 18A to 18C, the etch stop layer 404, the mold layer 410, and the first support layer 412 are formed on the substrate 102 in this order. The plurality of first conductive patterns 420 are formed on the substrate 102 through these components.

The processes using the self-assembly process and described with reference to FIGS. 4A to 7B are then performed at least once, thereby forming upper conductive patterns 640A, 640B, and 640C. In the present exemplary embodiment, the upper conductive patterns 640A, 640B, and 640C have a three-layered structure including a plurality of second conductive patterns 640A, a plurality of third conductive patterns 640B, and a plurality of fourth conductive patterns 640C.

By performing the self-assembly process described with reference to FIGS. 4A to 7B, the brush liner 132 and the second domain 134D2, which cover the first support layer 412 in this order, and the plurality of second holes 134H, which penetrate the second domain 134D2, are formed on the device in which the plurality of first conductive patterns 420 are formed as shown in FIG. 18C. The plurality of second conductive patterns 640A in the plurality of second holes 134H are then formed in a similar manner to that described with reference to FIGS. 9A-9B regarding the formation of the plurality of second conductive patterns 140. Detailed description of the plurality of second conductive patterns 640A has been provided with reference to FIGS. 9A-9B.

The second domain 134D2, in which the plurality of second holes 134H are formed by a method using the self-assembly process described with reference to FIGS. 5A to 7B, is then formed on a device in which the plurality of second conductive patterns 640A and the second domain 134D2 surrounding the plurality of second conductive patterns 640A are formed. The plurality of third conductive patterns 640B in the plurality of second holes 134H is then formed in a similar manner to that described with reference to FIGS. 9A-9B regarding the formation of the plurality of second conductive patterns 140. Detailed description of the plurality of third conductive patterns 640B has been provided with reference to FIGS. 9A-9B.

The second domain 134D2, in which the plurality of second holes 134H are formed by a method using the self-assembly process described with reference to FIGS. 5A to 7B, is further formed on a device in which the plurality of third conductive patterns 640B and the second domain 134D2 surrounding the plurality of third conductive patterns 640B are formed. The plurality of fourth conductive patterns 640C in the plurality of second holes 134H are then formed in a similar manner to that described with reference to FIGS. 9A-9B regarding the formation of the plurality of second conductive patterns 140. Detailed description of the plurality of fourth conductive patterns 640C has been provided with reference to FIGS. 9A-9B.

The plurality of first conductive patterns 420 and the upper conductive patterns 640A, 640B, and the 640C may constitute a plurality of lower electrodes LE6. In the present exemplary embodiment, although the plurality of lower electrodes LE6 is formed by sequentially forming the plurality of second conductive patterns 640A, the plurality of third conductive patterns 640B, and the plurality of fourth conductive patterns 640C on the plurality of first conductive patterns 420 in a vertical direction in this order by performing the self-assembly process three times, the inventive concept is not limited thereto. According to the inventive concept, an upper conductive pattern including at least one conductive pattern is formed on the plurality of first conductive patterns 420 by performing the self-assembly process described with reference to FIGS. 5A to 7B at least once, whereby a vertical height of a lower electrode may be increased by a vertical height of the at least one conductive pattern from the plurality of first conductive patterns 420. In forming a plurality of lower electrodes having increased vertical heights, the number of times applying the self-assembly process set forth above may be variously selected as needed.

In some exemplary embodiments, unlike in the descriptions given above with reference to FIG. 20A, while a stack structure including at least one second domain 134D2 having the plurality of second holes 134H therein is formed over the first support layer 412, respective processes of forming the plurality of first conductive patterns 420, forming the plurality of second conductive patterns 640A, forming the plurality of third conductive patterns 640B, and forming the plurality of fourth conductive patterns 640C may be omitted. In this embodiment, instead of forming the plurality of first conductive patterns 420, the plurality of second conductive patterns 640A, the plurality of third conductive patterns 640B, and the plurality of fourth conductive patterns 640C, sacrificial films may be formed to fill electrode spaces in which the components set forth above are to be formed, or subsequent processes may be performed while the electrode spaces are empty. The sacrificial films may be removed from a device in which the stack structure including at least one second domain 134D2 having the plurality of second holes 134H therein is formed, whereby insides of the electrode spaces, (e.g., insides of the plurality of lower electrode holes LH) and insides of the plurality of second holes 134H included in the at least one second domain 134D2 vertically stacked may be emptied. The plurality of second holes 134H are in communication with the plurality of lower electrode holes LH. The insides of the plurality of lower electrode holes LH and the insides of the plurality of second holes 134H may then be filled with a conductive material, thereby forming integral-type lower electrodes. In this embodiment, a process of forming a conductive layer for forming the integral-type lower electrodes may be performed only once, unlike in the case where the process of forming a conductive layer is performed numerous times to form the lower electrodes LE6 including the plurality of first conductive patterns 420, the plurality of second conductive patterns 640A, the plurality of third conductive patterns 640B, and the plurality of fourth conductive patterns 640C.

Figure 20B:
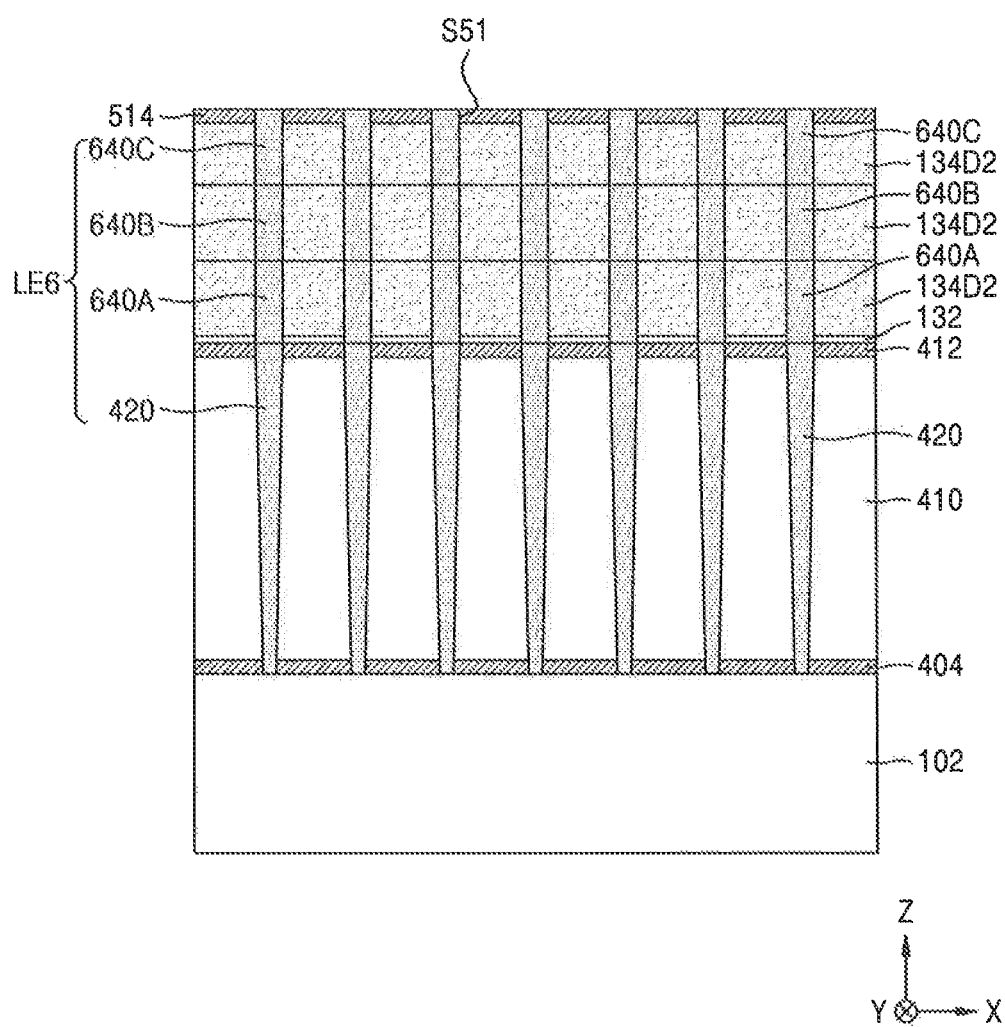

Referring to FIG. 20B, in a similar manner to that described with reference to FIG. 19B, the support space S51, which exposes an upper outer sidewall of each of the plurality of fourth conductive patterns 640C, is formed by partially removing the second domain 134D2 surrounding the plurality of fourth conductive patterns 640C, and the second support layer 514, which fills the support space S51 is formed.

Figure 20C:
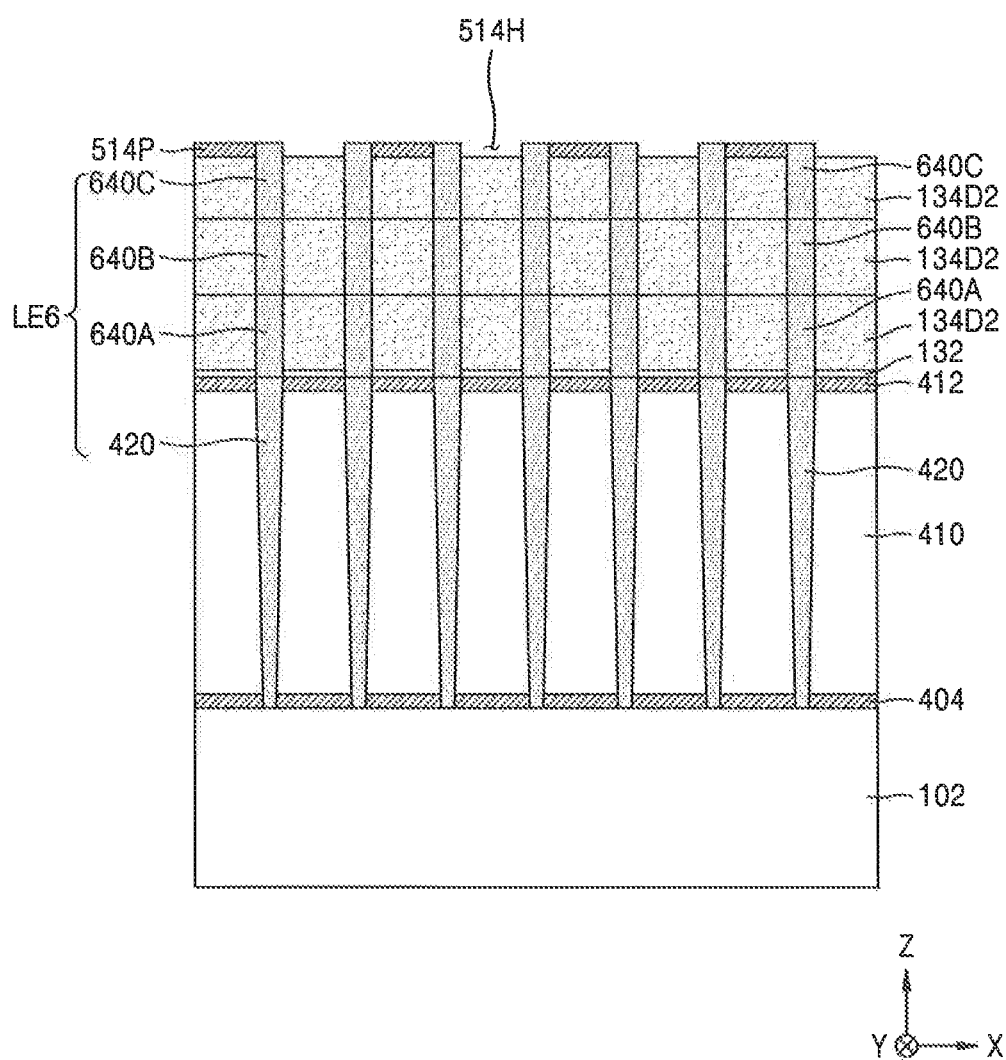

Referring to FIG. 20C, in the same manner as described with reference to FIG. 19C, the second support pattern 514P having the plurality of openings 514H may be formed by partially removing the second support layer 514. Portions of the top surface of the second domain 134D2 surrounding the plurality of fourth conductive patterns 640C may be exposed by the plurality of openings 514H formed in the second support pattern 514P.

Figure 20D:
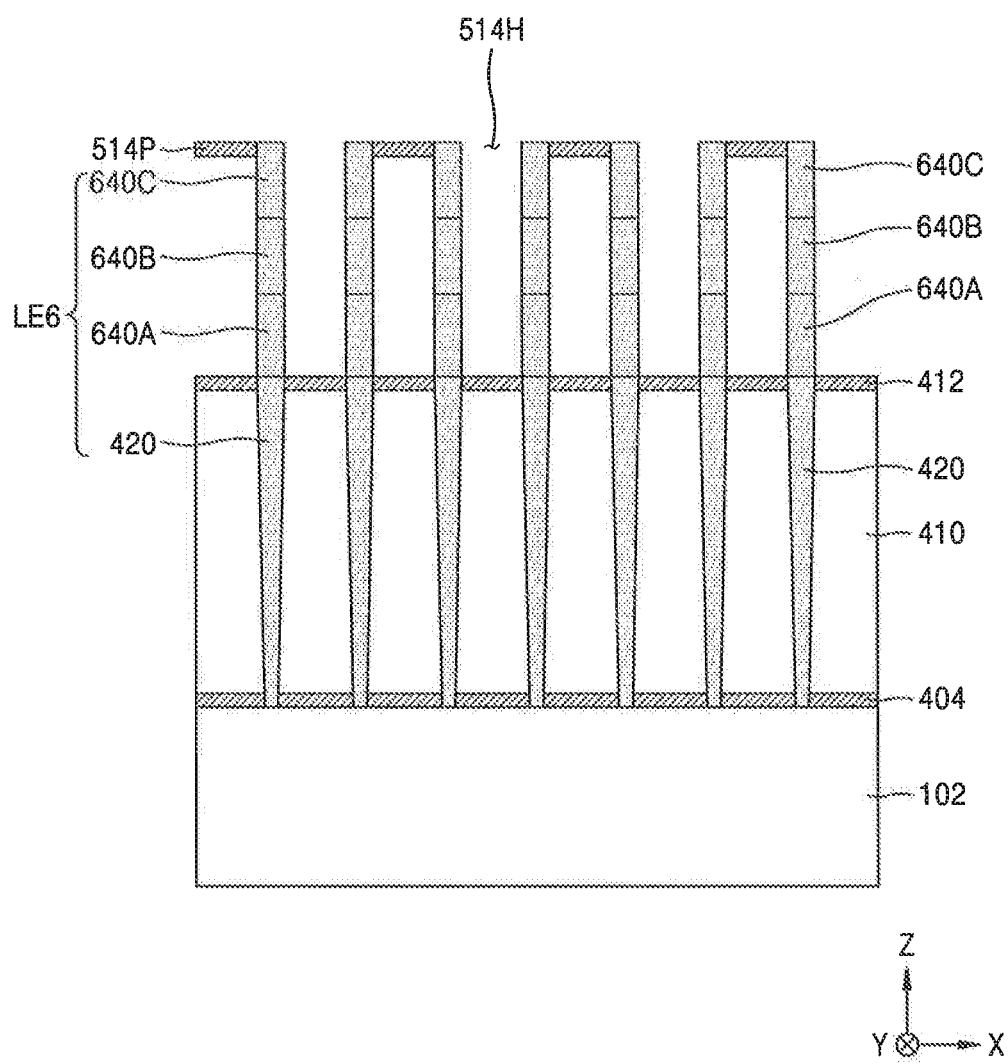

Referring to FIG. 20D, the second domain 134D2 and the brush liner 132 may be removed through the plurality of openings 514H formed in the second support pattern 514P, thereby exposing an outer sidewall of each of the plurality of second conductive patterns 640A, an outer sidewall of each of the plurality of third conductive patterns 640B, an outer sidewall of each of the plurality of fourth conductive patterns 640C, and the top surface of the first support layer 412.

Figure 20E:
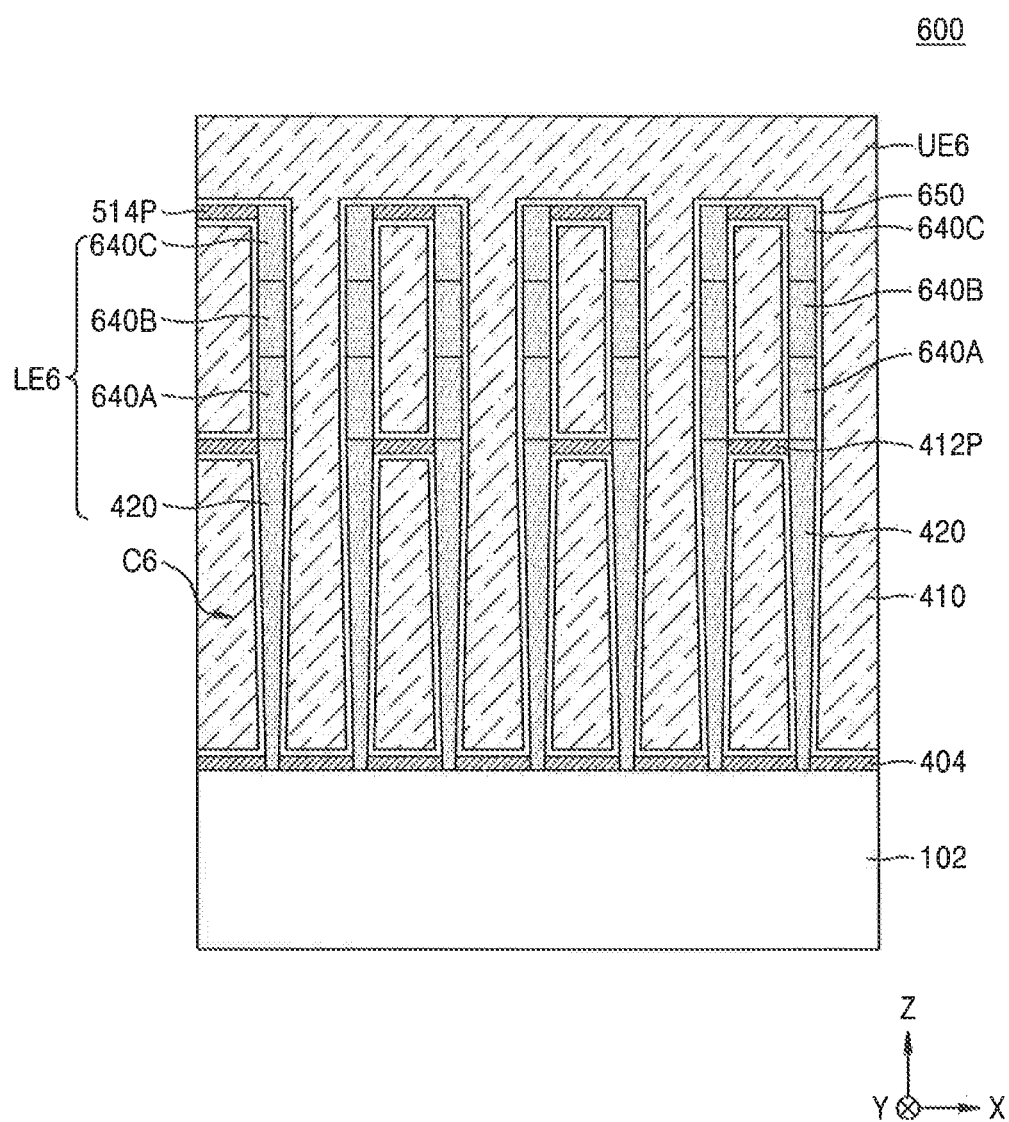

Referring to FIG. 20E, in the same manner as described with reference to FIGS. 18I and 18J, the first support pattern 412P having the plurality of openings 412H may be formed by partially removing the first support layer 412, and the outer sidewall of each of the plurality of first conductive patterns 420 and the top surface of the etch stop layer 404 are exposed by removing the mold layer 410.

A dielectric film 650 and an upper electrode UE6 may then be formed in this order on the plurality of lower electrodes LE6 including the plurality of first conductive patterns 420, the plurality of second conductive patterns 640A, the plurality of third conductive patterns 640B, and the plurality of fourth conductive patterns 640C, whereby an integrated circuit device 600 including a capacitor C6 that includes each lower electrode LE6, the dielectric film 650, and the upper electrode UE6 may be fabricated.

The dielectric film 650 may be formed to a uniform thickness to conformally cover the outer sidewall of each of the plurality of first conductive patterns 420, the outer sidewall of each of the plurality of second conductive patterns 640A, the outer sidewall of each of the plurality of third conductive patterns 640B, the outer sidewall of each of the plurality of fourth conductive patterns 640C, the top surface of the etch stop layer 404, the surface of the first support pattern 412P, and the surface of the second support pattern 514P. For more description of the dielectric film 650 and the upper electrode UE6, reference may be made to the description of the dielectric film 150 and the upper electrode UE, which have been provided with reference to FIGS. 11 and 12.

While the methods of fabricating the integrated circuit devices 400 and 600 including the capacitors C4 and C6 that include the lower electrodes LE4 and LE6 of pillar types, respectively, have been described with reference to FIGS. 17 to 20E, integrated circuit devices having various structures may be fabricated by making various changes and modifications from the descriptions given with reference to FIGS. 17 to 20E without departing from the spirit and scope of the inventive concept.

The method of fabricating an integrated circuit device in accordance with exemplary embodiments improves the capacitance of a capacitor and the vertical height of a lower electrode may be increased by the self-assembly process. Since the self-assembly process is used to increase the vertical height of the lower electrode, a sufficient separation distance between lower electrodes adjacent to each other may be secured in respective upper portions of a plurality of lower electrodes even though an aspect ratio of each of the plurality of lower electrodes is relatively high, whereby an insulation margin between the adjacent lower electrodes may be secured. Therefore, the capacitance of the capacitor may be effectively improved within a relatively small cell area on a substrate, whereby electrical properties of the capacitor and the reliability of the integrated circuit device may be improved.

While the inventive concept has been particularly shown and described with reference to exemplary embodiments thereof, it will be understood that various changes in form and details may be made therein without departing from the spirit and scope of the following claims.

What is claimed is:

1. A method of fabricating an integrated circuit device, the method comprising:
   forming a mold layer on a main surface of a substrate;
   forming a first hole in the mold layer by partially etching the mold layer, the first hole having a first inner wall that has a first tilt angle that is oblique with respect to a plane parallel to the main surface of the substrate;
   forming a first conductive pattern in the first hole;
   forming a block copolymer layer on the mold layer and the first conductive pattern;
   forming a self-assembly layer having a first domain and a second domain by performing phase separation of the block copolymer layer, wherein the first domain covers the first conductive pattern and the second domain covers the mold layer;
   forming a second hole in the self-assembly layer by entirely removing the first domain from the self-assembly layer, wherein the second hole communicates with the first hole and has a second inner wall having a second tilt angle with respect to a plane parallel to the main surface of the substrate, the second tilt angle being different from the first tilt angle of the first inner wall of the first hole; and
   forming a second conductive pattern in the second hole, the second conductive pattern contacting the first conductive pattern.

2. The method according to claim 1, wherein the block copolymer layer comprises a copolymer of an organic polymer and an inorganic polymer.

3. The method according to claim 2, further comprising:
   converting the second domain into an inorganic oxide layer after the forming of the second hole and prior to the forming of the second conductive pattern; and
   exposing an outer sidewall of the first conductive pattern and an outer sidewall of the second conductive pattern by simultaneously removing the mold layer and the second domain.

4. The method according to claim 1, wherein the block copolymer layer comprises a copolymer of two different organic polymers.

5. The method according to claim 1, wherein the second tilt angle of the second inner wall is greater than the first tilt angle of the first inner wall of the first hole.

6. The method according to claim 1, further comprising:
   selectively forming a brush liner on a surface of the mold layer prior to the forming of the block copolymer layer, wherein the brush liner is not formed on the first conductive pattern.

7. The method according to claim 6, wherein:
   the block copolymer layer comprises a copolymer of an organic polymer and an inorganic polymer; and
   the brush liner comprises Si atoms.

8. The method according to claim 6, wherein:
   the block copolymer layer comprises a copolymer of a first organic polymer and a second organic polymer, the first organic polymer and second organic polymer having different structures from each other; and
   the brush liner comprises an organic polymer.

9. The method according to claim 1, wherein the first hole extends through an entire thickness of the mold layer to expose the substrate.

10. A method of fabricating an integrated circuit device, the method comprising:
    forming a mold layer on a substrate;
    forming a plurality of first holes in the mold layer by partially etching the mold layer;

forming a plurality of first conductive patterns in the plurality of first holes; and forming at least one upper conductive pattern on the plurality of first conductive patterns, the at least one upper conductive pattern being connected to the plurality of first conductive patterns, wherein the at least one upper conductive pattern is formed by performing an upper conductive pattern forming process at least once, the upper conductive pattern forming process comprising:

forming a self-assembly layer having a plurality of first domains and a second domain by using a block copolymer, the plurality of first domains covering the plurality of first conductive patterns, and the second domain surrounding the plurality of first domains and covering the mold layer;

forming a plurality of second holes by entirely removing the plurality of first domains, the plurality of second holes respectively communicating with the plurality of first holes; and filling an inside of each of the plurality of second holes with a conductive material.

11. The method according to claim 10, wherein:
the block copolymer comprises a copolymer of an organic polymer and an inorganic polymer, wherein each of the plurality of first domains comprises the organic polymer, and the second domain comprises the inorganic polymer.

12. The method according to claim 11, wherein the upper conductive pattern forming process further comprises converting the second domain into an inorganic oxide layer after the forming of the plurality of second holes.

13. The method according to claim 12, wherein the upper conductive pattern forming process further comprises simultaneously removing the mold layer and the inorganic oxide layer after the filling of the inside of each of the plurality of second holes with the conductive material.

14. The method according to claim 10, wherein the block copolymer comprises a copolymer of a first organic polymer and a second organic polymer, the first organic polymer and second organic polymer having different structures from each other.

15. The method according to claim 10, further comprising:
forming a support space by removing a portion of the second domain after the forming of the at least one upper conductive pattern;
forming a support pattern in the support space, the support pattern having a plurality of openings;
removing a remaining portion of the second domain through the plurality of openings; and
removing the mold layer through the plurality of openings.

16. A method of fabricating an integrated circuit device, the method comprising:
forming a mold layer on a substrate;
forming a plurality of first holes in the mold layer by partially etching the mold layer;
forming a plurality of first conductive patterns in the plurality of first holes;
forming a self-assembly layer by using a block copolymer, the self-assembly layer comprising a plurality of first domains self-assembled on the plurality of first conductive patterns and a second domain self-assembled on the mold layer;
forming a plurality of second holes by removing the plurality of first domains, the plurality of second holes exposing the plurality of first conductive patterns;
converting the second domain into an inorganic oxide layer;
forming a plurality of second conductive patterns in the plurality of second holes, the plurality of second conductive patterns being connected to the plurality of first conductive patterns; and
removing the inorganic oxide layer and the mold layer.

17. The method according to claim 16, wherein the block copolymer comprises a copolymer of an organic polymer and an inorganic polymer, wherein each of the plurality of first domains comprises the organic polymer, and the second domain comprises the inorganic polymer.

18. The method according to claim 16, wherein the second domain is converted into the inorganic oxide layer by treating the second domain with oxygen plasma.

19. The method according to claim 16, further comprising:
forming a support space by partially removing the inorganic oxide layer after the forming of the plurality of second conductive patterns, the support space exposing an outer sidewall of each of the plurality of second conductive patterns; and
forming a support pattern in the support space, the support pattern having a plurality of openings,
wherein the inorganic oxide layer and the mold layer are removed through the plurality of openings.

20. The method according to claim 16, further comprising:
forming a dielectric film that covers a surface of each of the plurality of second conductive patterns; and
forming an upper electrode that covers the plurality of second conductive patterns with the dielectric film disposed therebetween.

* * * * *